(12) United States Patent
Song et al.

(10) Patent No.: US 9,123,894 B2
(45) Date of Patent: Sep. 1, 2015

(54) ELECTRONIC DEVICES, CIRCUITS AND THEIR MANUFACTURE

(75) Inventors: Aimin Song, Stockport (GB); Stephen Whitelegg, Stockport (GB); Yanming Sun, Weifang (CN); Shiwei Lin, Hainan (CN)

(73) Assignee: Pragmatic Printing Ltd., Sedgefield, County Durham (GB)

( * ) Notice: Subject to any disclaimer, the term of this patent is extended or adjusted under 35 U.S.C. 154(b) by 894 days.

(21) Appl. No.: 13/146,389

(22) PCT Filed: Jan. 27, 2010

(86) PCT No.: PCT/GB2010/050123
§ 371 (c)(1),
(2), (4) Date: Mar. 8, 2012

(87) PCT Pub. No.: WO2010/086651
PCT Pub. Date: Aug. 5, 2010

(65) Prior Publication Data
US 2012/0153428 A1    Jun. 21, 2012

(30) Foreign Application Priority Data
Jan. 28, 2009 (GB) .................................. 0901389.7

(51) Int. Cl.
*H01L 51/00* (2006.01)
*H01L 21/764* (2006.01)
(Continued)

(52) U.S. Cl.
CPC .......... *H01L 51/0014* (2013.01); *H01L 21/764* (2013.01); *H01L 27/28* (2013.01); *H01L 51/0023* (2013.01); *H01L 51/0036* (2013.01);
(Continued)

(58) Field of Classification Search
CPC ..................................................... H01L 21/764
See application file for complete search history.

(56) References Cited

U.S. PATENT DOCUMENTS 6,911,385 B1 * 6/2005 Haubrich et al. ............. 438/610
8,080,152 B2 * 12/2011 Sirringhaus .................. 205/775
(Continued)

FOREIGN PATENT DOCUMENTS

DE    102005022000 A1    11/2006
JP    2005-249947 A    9/2005
(Continued)

OTHER PUBLICATIONS

International Preliminary Report on Patentability and Written Opinion of the International Searching Authority, mailed Aug. 11, 2011, for corresponding International Application No. PCT/GB2010/050123, 8 pages.
(Continued)

*Primary Examiner* — Angel Roman
(74) *Attorney, Agent, or Firm* — Klarquist Sparkman, LLP

(57) ABSTRACT

A method of manufacturing an electronic device, comprising a layer of semiconductive material and at least one insulative feature arranged to interrupt the layer of semiconductive material, comprises: providing a layer of semiconductive material, and a layer of compressible material supporting the layer of semiconductive material; and forming the or each insulative feature by a method comprising displacing a respective selected portion of the layer of semiconductive material towards the compressible material so as to compress compressible material under the or each displaced portion and separate at least partly the or each displaced portion from undisplaced semiconductive material.

66 Claims, 14 Drawing Sheets

(51) Int. Cl.
*H01L 27/28* (2006.01)
*H01L 51/05* (2006.01)

(52) U.S. Cl.
CPC ....... *H01L 51/0575* (2013.01); *H01L 2251/105* (2013.01)

(56) References Cited

U.S. PATENT DOCUMENTS

| | | | | |
|---|---|---|---|---|
| 2002/0064896 | A1* | 5/2002 | Zhao et al. | 438/31 |
| 2005/0008880 | A1* | 1/2005 | Kunze et al. | 428/447 |
| 2006/0180805 | A1* | 8/2006 | Lutz et al. | 257/40 |
| 2007/0099323 | A1* | 5/2007 | Chang et al. | 438/30 |
| 2009/0074955 | A1* | 3/2009 | Rowland | 427/97.3 |
| 2011/0108899 | A1* | 5/2011 | Jonas et al. | 257/295 |

FOREIGN PATENT DOCUMENTS

| | | |
|---|---|---|
| WO | WO2006/097304 A1 | 9/2006 |
| WO | WO2006/120414 A2 | 11/2006 |
| WO | WO2007/074404 A | 7/2007 |

OTHER PUBLICATIONS

International Search Report and Written Opinion of the International Searching Authority, mailed May 27, 2010, for corresponding International Application No. PCT/GB2010/050123, 13 pages.
United Kingdom Intellectual Property Office, "Search Report under Section 17" for Great Britain Application No. B0901389.7, Jun. 23, 2009, 1 page.
United Kingdom Intellectual Property Office, "Examination Report under Section 18(3)" for Great Britain Application No. B0901389.7, Mar. 28, 2013, 1 page.

\* cited by examiner

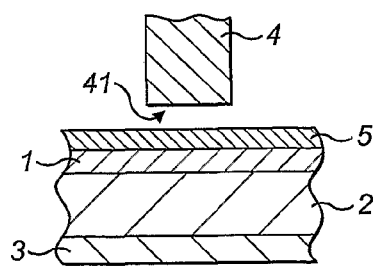
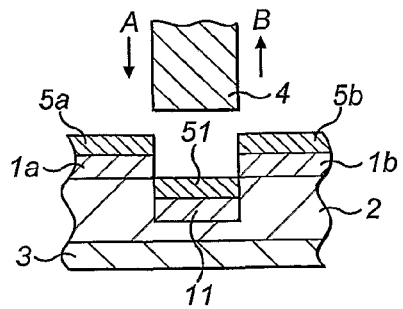
FIG. 3a    FIG. 3b
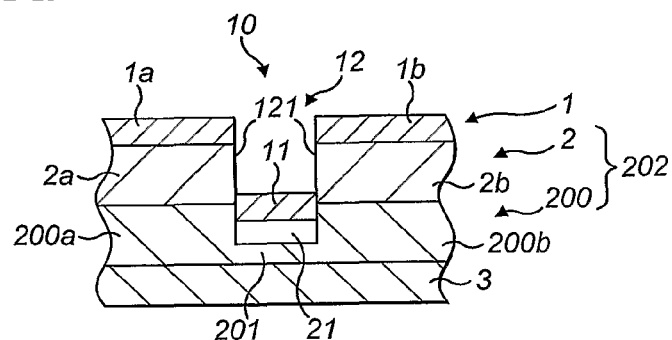
FIG. 4
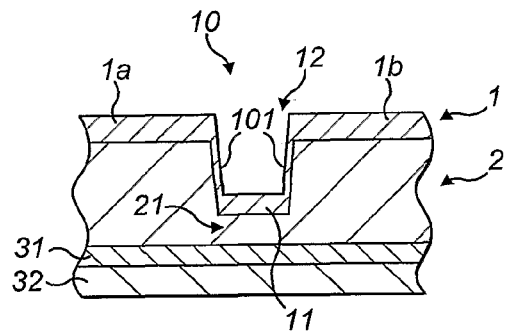
FIG. 5
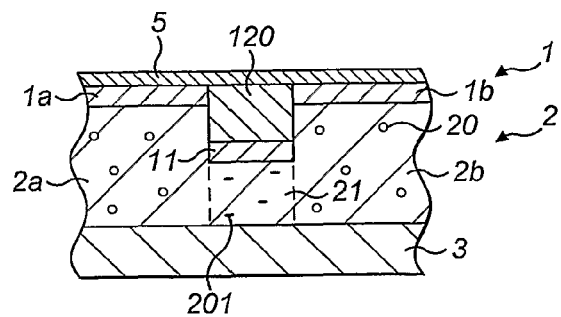
FIG. 6

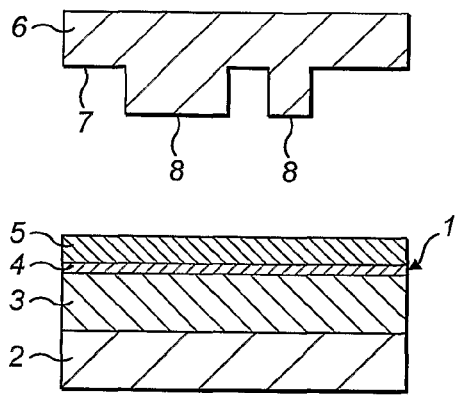
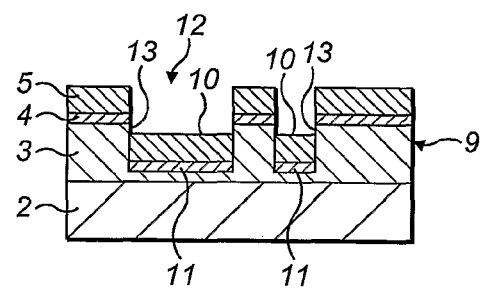
FIG. 31a     FIG. 31b
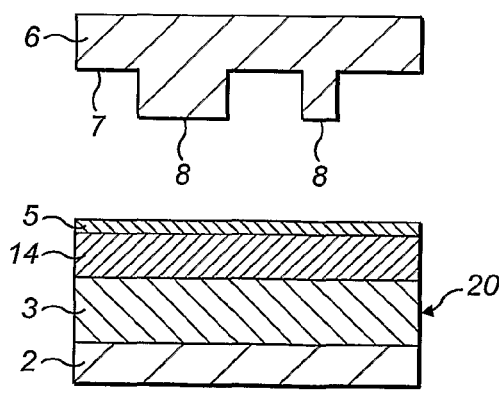
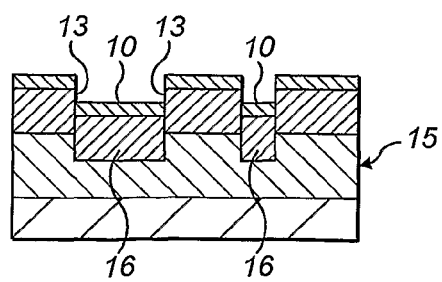
FIG. 32a     FIG. 32b 0μm　　　　　　　　　　3.08μm 0μm　　　　　　　　　　3.05μm

ELECTRONIC DEVICES, CIRCUITS AND THEIR MANUFACTURE

CROSS REFERENCE TO RELATED APPLICATIONS

This is the U.S. National Stage of International Application No. PCT/GB2010/050123, filed Jan. 27, 2010, which in turn claims the benefit of Great Britain Application No. GB0901389.7, filed Jan. 28, 2009.

FIELD OF THE INVENTION

The present invention relates to electronic devices and electronic circuits and methods of manufacturing such devices and circuits. In particular, although not exclusively, certain embodiments of the invention are concerned with nano electronic devices and circuits and their manufacture, that is devices and circuits having features with dimensions in the range of 10 to 300 nanometres.

BACKGROUND TO THE INVENTION

Electronic devices and features comprising a layer of semiconductive material patterned with insulated features are known. Examples of such devices and circuits are disclosed in WO 02/086973 A2, WO 2006/008467 A1, and WO 2006/120414 A2. The contents of each of these documents are incorporated herein by reference. The disclosed devices include devices formed in a single layer of semiconductive material and in which a pattern of insulative features has been formed to interrupt the semiconductive layer and define at least one operational characteristic of the device. These documents also disclose certain methods suitable for forming the insulative features required to define these electronic devices in the layer of semiconductive material. Those techniques include X-ray beam and electron beam lithography. Another suitable technique disclosed is a so-called nano imprint process (from U.S. Pat. No. 5,772,905) in which a mould having extremely small projections formed by E-beam lithography is pressed into a plastics polymer layer on a substrate so as to create depressions in the layer corresponding to the mould projections. It is further disclosed that an etching process may then be carried out to expose the substrate (underlying the patterned layer) in the depression areas. In other words, the disclosed technique embosses a pattern of depressions in the upper layer supported by the substrate. The substrate is not deformed by the patterning process. The embossing process forms depressions, but generally speaking do not completely interrupt the upper layer; some of the upper layer material remains at least at the bottom of the depressions, thereby providing a connection between the upper layer material on one side of the depression with that on the other side. In order to convert an embossed depression into a fully insulating feature it is necessary to perform some post-processing, such as etching, to remove or "clean out" upper layer material from the depressions, leaving exposed insulative substrate. Clearly, whilst this imprinting or embossing technique offers some advantages in terms of facilitating the initial patterning of the upper layer, it has disadvantages as a technique for forming insulative features, because additional processing steps are required. Furthermore, this imprinting technique may undesirably distort the upper layer of semiconductive material, at least in the vicinity of each embossed trench. Furthermore, the etching technique required to expose the underlying substrate may result in undesirable removal of semiconductive material from other portions of the semiconductive layer.

It will be appreciated that in the fabrication of electronic devices and circuits, disadvantages associated with additional processing steps include the fact that the total manufacturing time is increased, and so are the complexity and costs of the overall process.

An additional problem with existing techniques for etching features in semiconductive materials is that those techniques may be suitable for use with certain materials but not others. The requirement to choose a technique compatible with the device materials being employed represents a further restriction on the process engineering.

SUMMARY OF THE INVENTION

It is an aim of certain embodiments of the invention to solve, mitigate or obviate, at least partly, at least one of the problems and/or disadvantages associated with the prior art.

Certain embodiments of the invention aim to provide methods which facilitate the manufacture of electronic devices and/or circuits comprising a plurality of devices. Certain embodiments aim to provide methods of manufacture which are faster than certain prior art techniques. Further embodiments aim to provide methods of manufacture which are compatible with fast, high volume production of electronic devices and/or circuits. Certain embodiments aim to provide methods of manufacturing electronic circuits comprising a plurality of electronic devices formed on a common, flexible substrate. Certain embodiments aim to provide methods of manufacturing electronic devices and/or circuits having a reduced number of steps compared with prior art techniques.

According to a first aspect of the present invention there is provided a method of manufacturing an electronic device (or component) comprising a layer of semiconductive material and at least one insulative feature, the or each insulative feature being arranged to interrupt the layer of semiconductive material (e.g. so as to at least inhibit current flow across the feature), the method comprising:
    providing a layer of semiconductive material, and a layer of compressible material supporting the layer of semiconductive material; and
    forming the or each insulative feature by a method comprising displacing a respective selected portion of the layer of semiconductive material towards the compressible material so as to compress compressible material under the or each displaced portion and separate at least partly the or each displaced portion from undisplaced semiconductive material.

For the purposes of the present specification, the term "insulative" is to be understood as encompassing both completely insulative (i.e. completely electrically isolating) features as well as "relatively insulative", that is having a conductivity less than, or substantially less than, that of the uninterrupted semiconductive material. In other words, each insulative feature provides at least a partial barrier to current flow in the layer of semiconductive material across the feature.

In certain embodiments, the electronic device comprises a plurality of said insulative features.

In certain embodiments, the insulative feature or features define a pattern, and the step of forming the or each insulative feature comprises patterning the layer of semiconductive material with the insulative feature or features.

The term "pattern" in this context should be interpreted as meaning any predetermined arrangement, which could comprise a single element, shape, line or other feature, or may comprise a plurality of elements, which may be separate from one another, connected to one another, or the pattern may comprise a combination of one or more separate elements and one or more connected elements.

According to another aspect of the invention there is provided an electronic device comprising a patterned layer of semiconductive material, the method comprising:

providing a layer of semiconductive material, and a layer of compressible material supporting the layer of semiconductive material; and patterning the layer of semiconductive material by displacing at least one selected portion of the layer of semiconductive material towards the compressible material so as to compress compressible material under the or each displaced portion and separate (divide, sever) at least partly the or each displaced portion from undisplaced semiconductive material (e.g. undisplaced semiconductive material immediately adjacent to the displaced portion) such that the or each displaced portion forms at least part of a respective insulative feature interrupting the layer of undisplaced semiconductive material, whereby the insulative feature or features define a pattern.

In certain embodiments, said displacing comprises separating the or each displaced portion from undisplaced semiconductive material.

In certain embodiments, the or each displaced portion forms a said insulative feature.

In certain embodiments, the pattern defines at least one electrical and/or electronic characteristic of the device.

In certain embodiments, the electronic device is an active device.

In certain embodiments, the pattern defines at least one elongate channel of semiconductive material extending from a first portion (or area) of the layer of semiconductive material to a second portion (or area) of the layer of semiconductive material.

In certain embodiments, the length of this channel may be in the range 60 to 2000 nm and the width of the channel may be in the range 20-400 nm In certain embodiments, the pattern defines at least one gate region of the layer of semiconductive material to which a potential may be applied to control a conductivity of the elongate channel.

In certain embodiments, the gate region comprises at least part of one of the first and second regions.

In certain embodiments, the gate region is distinct (separated) from the first and second regions.

For example, this gate region may be separated from the first and second regions by one or more of the insulative features.

In certain embodiments, the pattern is arranged such that the device is operable as (i.e. functions as) at least one of: a self-switching device; a diode; a FET; a memory device; and a logic gate (e.g. an AND gate; a NAND gate; an OR gate; a NOR gate; a NOT gate).

In certain embodiments, the pattern is arranged to define a plurality of electronic devices in the layer of semiconductive material.

In certain embodiments, the pattern is further arranged to define at least one connecting portion of semiconductive material in the layer of semiconductive material, the or each connecting portion providing an electrical connection between a respective pair of said plurality of electronic devices.

In certain embodiments, the pattern is arranged to define a plurality of electronic devices and interconnections in the layer of semiconductive material, the plurality of electronic devices and interconnections forming at least part of an electronic circuit.

It will be appreciated that these interconnections may include connections between two or more devices, between a device and a voltage or supply rail or rails, a connection between a device and a terminal etc.

In certain embodiments, the or each selected portion has a width in the range from 300 nm to 1 mm depending on the need of integration density and easy of manufacture.

In certain embodiments, the layer of semiconductive material has a thickness T and said displacing comprises displacing the or each selected portion towards the compressible material by a distance greater than T.

In certain embodiments, the layer of semiconductive material has a thickness T and said displacing comprises displacing the or each selected portion towards the compressible material by a distance less than or equal to T.

In certain embodiments, the compressible material is at least partially resilient, the method further comprising allowing the or each displaced portion to return at least partially towards the layer of semiconductive material.

In certain embodiments, the said displacing comprises producing an inelastic (i.e. permanent, irreversible, plastic etc) deformation of compressible material under the or each displaced portion, so as to leave the or each displaced portion permanently offset from the layer of semiconductive material.

In other words, the displacing of selected portions and the compression of compressible material may produce deformations of the compressible material having at least an inelastic component, such that when the force or action causing the displacement is removed, the compressible material does not return fully, or in certain cases does not return at all, to its original position, leaving the displaced portion of semiconductive material permanently offset from the semiconductive layer.

In certain embodiments, said inelastic deformation is such that the or each displaced portion is permanently displaced by a distance greater than T.

In certain embodiments, the displacement of the or each selected portion forms a permanent depression or trench in the layer of semiconductive material.

In some embodiments, the displacing operation may be such that substantially no semiconductive material lines the side walls of the depression or trench, such that the displaced portion of semiconductive material is electrically isolated or disconnected from portions of the semiconductive layer on either side of the trench. However, in alternative embodiments there may be some semiconductive material on the side walls of the depressions or trenches, and the method may comprise a step to remove such material in order to more fully electrically isolate the displaced portion from the undisplaced layer.

In certain embodiments, the method further comprises removing semiconductive material from side walls of the or each depression or trench.

In certain embodiments, the method further comprises filling the or each depression or trench with insulative material.

In certain embodiments, said displacing comprises severing the or each selected portion of semiconductive material from the layer of semiconductive material.

In certain embodiments, said compressible material is porous and said displacing comprises compressing the compressible material to reduce a porosity of the compressible material under the or each displaced portion.

In certain embodiments, said displacing comprises compressing compressible material from a first density to a second, higher density.

In certain embodiments, said compressible material is an insulative material, for example an insulative material selected from a list comprising: polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate.

In certain embodiments, the method further comprises providing a substrate arranged to support the compressible layer.

Typically, this substrate will then form an integral part of the manufactured device, the substrate supporting both the compressible layer and the layer of semiconductive material patterned with one or more insulative features by the manufacturing method.

In certain embodiments, the substrate is substantially non-compressible.

In certain embodiments the substrate comprises a layer of material selected from a list comprising: glass (rigid or flexible); polymer (e.g. polyethylene naphthalate or polyethylene terephthalate); polymeric foil; paper; insulator coated metal (e.g. coated stainless-steel); cellulose; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyamide (e.g. Nylon); poly(hydroxyether); polyurethane; polycarbonate; polysulfone; polyarylate; acrylonitrile butadiene styrene, 1-Methoxy-2-propyl acetate (SU-8), polyhydroxybenzyl silsesquioxane (HSQ), polyimide, Benzocyclobutene (BCB), $Al_2O_3$, $SiO_xN_y$, $SiO_2$, $Si_3N_4$.

In certain embodiments, the method further comprises providing a support surface, and supporting the compressible layer with the support surface during said displacing.

In such embodiments, the support surface can then be removed or separated from the compressible layer and semiconductor layer after patterning. In certain embodiments the support surface is flat, but in other embodiments the support surface may have another shape, for example it may be curved. In certain embodiments, the support surface is the cylindrical surface of a support roller.

In certain embodiments, the layer of compressible material is arranged to support the layer of semiconductive material directly.

In certain embodiments, the method further comprises providing at least one intermediate layer of material between the layer of semiconductive material and the layer of compressible material.

In certain embodiments the intermediate layer of material may comprise or consist of material selected from a list comprising: self-assembled monolayer, siloxanes, thin-film inorganic oxide (e.g. alumina, silica, silicon sub-oxide) or nitride (e.g. SiN) or other materials which can selectively promote or discourage adhesion across the whole layer or can be patterned to provide regions of relatively good or poor adhesion as appropriate. The material choice would be determined by matching the hydrophobicity or hydrophilicity of the intermediate layer with that of the semiconductor material. The intermediate layer should be substantially insulating though it may be used to affect and/or control the charge carrier concentration within the semiconductor material.

Suitable self-assembled monolayers could be selected from the following list:

Organosilane such as 3-Aminopropyl-triethoxysilane, Trichloro(1H,1H,2H,2H-perfluorooctyl)silane $[CF_3(CF_2)_5 CH_2CH_2SiCl_3]$, Trichloro(3,3,3-trifluoropropyl)silane $[CF_3CH_2CH_2SiCl_3]$, Triethoxy(1H,1H,2H,2H)perfluorodecylsilane $[(CF_3)(CF_2)_7(CH_2)_2Si(OC_2H_5)_3]$, Octadecyltrichlorosilane $[CH_3(CH_2)_{17}SiCl_3]$, Butyltrichlorosilane $[CH_3(CH_2)_3SiCl_3]$, Trichloro(octyl)silane $[CH_3(CH_2)_7 SiCl_3]$ and Hexamethyldisilazane $[CH_3)_3SiNHSi(CH_3)_3]$. Other organosilane materials, which may be used in embodiments of the invention, are contained within the following articles incorporated by reference herein: *Nature Materials* 3, 317-322 (2004); PRAMANA—JOURNAL OF PHYSICS, 67(1), pp 17-32, JUL 2006; J. Appl. Phys. 96, 6431 (2004); Appl. Phys. Lett. 91, 192112 (2007).

Alternatively or in addition to the intermediate layer, other processing techniques may be used in embodiments of the invention to modify the surface (e.g. to improve adhesion of the semiconductive material to the compressible material and/or intermediate layer) prior to deposition or introduction of the semiconductive material. These include UV, plasma, ozone, corona discharge, piranha etch, and surface treatment such as described in EP1124791 or U.S. Pat. No. 7,034,129, the contents of which are incorporated by reference herein.

In certain embodiments, said displacing comprises pressing (urging) the or each selected portion towards the compressible layer using an embossing tool (which in certain embodiments may also be described as a stamp or shim).

In general, this embossing tool may take a wide variety of forms, and may be described as some means for positioning with respect to the semiconductive layer and then urging towards the layer of compressible material supporting the semiconductive layer so as to displace a selected portion or portions of the semiconductive material. The embossing tool may be arranged to produce the insulative features only by stamping (i.e. while any embossing surface of the embossing tool is in the process of pressing a portion of semiconductive material towards the compressible layer that surface is confined to moving only in a direction substantially perpendicular to the semiconductive layer; there is substantially no relative movement between the embossing surface and semiconducting layer in any direction along the semiconductive layer). However, in alternative embodiments, the embossing tool may be arranged so as to be moveable, whilst depressing the semiconductive layer (either directly or indirectly), in one or more directions substantially parallel to that layer so as to produce an extended insulative feature. In other words, whereas in certain embodiments the embossing tool may be arranged to produce insulative features by a pressing or stamping process, in alternative embodiments the embossing tool may be moveable so as to "write" insulative features in the substrate. Such written features can include insulative lines, for example.

In certain embodiments, the embossing tool comprises at least one embossing feature raised above a base surface, the method comprising urging the embossing tool towards the compressible layer such that each embossing feature displaces a respective selected portion of the layer of semiconductive material.

In other words, the embossing tool may comprise a plurality of embossing features, each corresponding to a respective insulative feature in the semiconductive layer of the manufactured device.

In certain embodiments, the embossing tool comprises a plurality of said embossing features arranged to define the pattern of insulative features in the semiconductive layer of the device.

In certain embodiments, the method further comprises using the embossing tool to displace a plurality of selected portions of the layer of semiconductive material in parallel.

In certain embodiments, the method comprises using the embossing tool to displace a plurality of portions of semiconductive material in parallel so as to define a plurality of devices (and, optionally, one or more interconnections between the devices) in the layer of semiconductive material in parallel (i.e. at the same time).

In certain embodiments, the method further comprises arranging the embossing tool such that the base surface is substantially planar, arranging the layer of semiconductive material to be substantially planar and parallel to the base surface, and urging the embossing tool towards the layer of semiconductive material such that each embossing feature displaces a respective selected portion of the layer of semiconductive material at the same time.

In certain embodiments, the embossing tool is substantially rigid.

In certain embodiments, the embossing tool is substantially flexible, the method further comprising supporting the embossing tool on a substantially planar (flat) support surface.

In certain embodiments, the method further comprises arranging the embossing tool such that the base surface lies substantially on the surface of a cylinder having a longitudinal axis, and rotating the embossing tool about said axis to pattern the layer of semiconductive material with the or each embossing feature of the tool.

In certain embodiments, the embossing tool is substantially flexible, the method further comprising supporting the embossing tool on a cylindrical surface (e.g. the surface of a support roller).

In certain embodiments, the embossing tool has a three-dimensional pattern or step created with two or more levels (e.g. the embossing tool may comprise a plurality of embossing surfaces arranged at a plurality of different heights with respect to a base surface), such as described in U.S. Pat. No. 7,202,179, for example. In other words, the embossing tool may comprise stepped embossing features, at two or more heights or levels.

In certain embodiments, the layer of semiconductive material and the layer of compressible material are substantially flexible, the method further comprising supporting the layers of semiconductive and compressible material on a cylindrical support surface during said displacing.

In certain embodiments, at least one embossing feature comprises an embossing surface raised a distance d above the base surface.

In certain embodiments, d can be in the range or ranges 10 to 3000 nm.

In certain embodiments, the or each embossing surface is substantially flat.

In certain embodiments, the or each embossing feature has a substantially rectangular cross section.

In certain embodiments, the or each embossing surface has a width w.

In certain embodiments, w can be in the range or ranges 10 to 3000 nm

In certain embodiments, d is substantially equal to w.

In certain embodiments, d is >w.

In certain embodiments, d is ≥2w.

In certain embodiments, the aspect ratio of the embossing features can be even higher, for example d may be 3, 4, 5, 6 times greater (or even more), than w.

In certain embodiments, the embossing tool comprises a plurality of embossing features, and wherein the minimum separation between any two of such embossing features is ≥w.

In certain embodiments, the embossing tool comprises at least one embossing surface, the method comprising using the or each embossing surface to press a respective selected portion of the layer of semiconductive material towards the compressible layer.

In certain embodiments, the method further comprises pressing the or each embossing surface directly against a respective portion of the layer of semiconductive material to displace that portion.

In certain embodiments, the method further comprises coating the or each embossing surface (e.g. with one or more coating materials) before using each coated embossing surface to displace a respective portion of the layer of semiconductive material.

In certain embodiments, the coating material is arranged to reduce adhesion between the embossing surface and the layer of semiconductive material, or an intermediate layer of material between the embossing surface and semiconductive material to improve the definition of the insulative features formed by the embossing technique. The use of a suitable coating material can reduce or even prevent the coating of the side walls of any trenches with semiconductive material, so helping electrically isolate the displaced portions from the undisplaced semiconductive material. The use of a suitable coating material can also reduce or prevent distortion of the nominally undisplaced layer of semiconductive material when the embossing tool is withdrawn (i.e. separated from the device pre-form).

In certain embodiments, the method further comprises providing at least one separating layer of material between the embossing tool and the layer of semiconductive material, and using the embossing tool to press the or each selected portion of semiconductive material towards the compressible layer through the separated layer or layers.

For example, the at least one separating layer may include a separating layer in the form of a non-stick or adhesion-reducing film used just in the manufacturing process, and/or the at least one layer of separating material may include a further device layer (such as a layer of insulative material) provided over the layer of semiconductive material. For example, the separating layers may include an upper layer, which together with the semiconductive layer, compressible layer, and any supporting layer beneath, form the eventual device or at least part of that device.

In certain embodiments, the method further comprises setting a temperature of the layer of semiconductive material to a predetermined value t1 before using the embossing tool to displace the or each selected portion.

It will be appreciated that controlling the temperature in this way can be used to various effects, such as to render the semiconductive material more flexible, to set the semiconductive material above or below a glass transition temperature, to embrittle the semiconductive material, etc.

In certain embodiments, the method further comprises setting a temperature of the embossing tool to a predetermined value t2 before using the embossing tool to displace the or each selected portion of semiconductive material.

In certain embodiments, t1=t2.

In certain embodiments, t1 does not equal t2.

In certain embodiments, t1>t2.

Such a method can be used to selectively cool the portions of semiconductive material to be displaced. In certain embodiments, this selective cooling can be used to selective embrittle the layer of semiconductive material prior to displacement and improve electrical separation from the undisplaced semiconductive material.

In certain embodiments, t1<t2.

Such methods can be used to selectively heat portions of semiconductive material to be displaced, and in certain embodiments this can achieve selective softening of portions of the layer of semiconductive material.

Thus, in certain embodiments, the method may comprise controlling (e.g. setting) the temperature of one or more of the embossing tool and semiconductive layer before using the embossing tool to displace selected portions of semiconductive material and produce insulative features. In certain embodiments, the methods may further comprise the step of controlling and changing the temperature of at least one of the embossing tool and semiconductive layer whilst the embossing tool is in contact with the semiconductive layer or at least some intermediate layer between the two, and then withdrawing the embossing tool away from the semiconductive layer whilst this different temperature is maintained. This gives the device fabricator another adjustable parameter which can be tailored generally to improve the electrical characteristics of the insulative features produced by the embossing feature and/or reduce (even to zero) the number of post-processing steps required to complete the semiconductive device or circuit.

In certain embodiments, the method further comprises controlling a force applied to pattern the layer of semiconductive material with the embossing tool.

In certain embodiments, the method further comprises modulating said force (e.g. by pulsing the force, or in other words modulating its magnitude).

In certain embodiments, the method further comprises controlling a length of time for which the embossing tool is pressing the or each selected portion.

In other words, in certain embodiments the method further comprises controlling a length of time for which the embossing tool is directly or indirectly in contact with the semiconductive layer before the end of the embossing step (i.e. before the embossing tool is withdrawn). This control may also take the form of controlling the speed of rotation of a roller supporting the embossing tool or layer of semiconductive material.

In certain embodiments, the method comprises pulsed-heating (e.g. by voltage, or other electrical, heating) of the embossing tool and/or pulsed pressure (i.e. modulation of the force applied to the embossing tool). This can improve the fidelity of the embossed features or structures.

For example, in certain embodiments the de-stamping (or withdrawal/separation of the embossing tool from the embossed "target" or object) can be done from a substantially cold material.

In certain embodiments, the method can comprise selectively heating the substrate, tool, or both.

In certain embodiments, the method comprises active cooling of the tool, for example prior to, or during contact with the target/object of the embossing process, such as to cool the tool before withdrawal/separation.

For example, certain embodiments comprise clamping an embossing tool to the target substrate at a desired temperature (e.g. room temperature, RT), then heating the arrangement to a desired higher temperature (e.g. 110 degrees C.), then applying a desired force (e.g. 2000N) to exert a desired pressure (e.g. 500N/cm2), holding for a predetermined time (e.g. 30 minutes), then cooling the arrangement down to a desired temperature (e.g. RT), and then separating the tool from the embossed target at this temperature (e.g. RT).

In certain embodiments, the semiconductive material comprises at least one semiconductive material selected from a list comprising: polymer semiconductor, organic semiconductor, printable inorganic semiconductor, crystalline inorganic semiconductor, amorphous inorganic semiconductor.

Examples of polymer semiconductor include polyalkylthiophenes (e.g. P3HT), polyarylamines (e.g. PTAA), copolymers of fluorene and thiophene, polyparaphenylenevinylene (PPV). Other examples of n- or p-type organic semiconductor materials are described in the following references: Chem. Rev. 2007, 107, 953-1010; Chem. Rev. 2007, 107, 1066-1096 and U.S. Pat. No. 7,029,945; Angew. Chem. Int. Ed. 2008, 47, 452-483 (precursor organic semiconductors); US2004038459A1, Nature Materials VOL 4 Aug. 2005 p601, Nature Materials VOL 5 Dec. 2006 p950, EP1579518A1 (blends of organic semiconductors with semiconductors).

Examples of organic conductors include polystyrenesulfonate doped poly(3,4-ethyelenedioxythiophene)—(PEDOT/PSS), polyaniline (PANI), polyfuran, polypyrrole or polycarbazole.

Other examples of organic conductors and semiconductors are described in the following articles incorporated by reference herein: Current Applied Physics 3 (2003) 293-305.

Examples of organic insulators include polymethyl methacrylate, polyvinylalcohol, polyvinyl acetate, polyvinyl pyrrolidone, polyvinylphenol, polyvinyl chloride, polystyrene, polyamide (e.g. Nylon), poly(hydroxyether), polyurethane, polycarbonate, polysulfone, polyarylate, acrylonitrile butadiene styrene, 1-Methoxy-2-propyl acetate (SU-8), polyhydroxybenzyl silsesquioxane (HSQ), polyimide, benzocyclobutene (BCB). Other examples are described in the following incorporated by reference herein: Chemistry of Materials (2004), 16(23), 4543-4555; Organic Electronics (2003), 4(1), 27-32; Advanced Functional Materials (2003), 13(3), 199-204.

The active material may optionally be chemically doped with one of the following:

For p-type: 2,3,5,6-tetrafluoro-7,7,8,8-tetracyano-quinodimethane (F4-TCNQ); $WO_3$, $MoO_3$ or $V_2O_5$; Lewis acids such as $FeCl_3$ or $SbCl_5$; Ruthenium tris-(terpyridine), Tetrakis_(1,2,3,3a,4,5,6,6a,7,8-decahydro-1,9,9b-triazaphenalenyl)_ditungsten_(II));

For n-type: Acridine Orange Base (AOB, C17H19N3); Li; Cs; Rhodamine P and examples contained within: U.S. Pat. No. 7,161,292, EP1837926, WO2007DE00587, EP1837927 (A1), WO2007107356, EP1643568 (A1), EP1538684 (A1), EP1860709 (A1), US2007278479, US2007148812, US2007145355

Examples of printable inorganic semiconductors include metal oxides such as indium tin-oxide, zinc oxide, titanium dioxide, indium zinc-oxide, gallium indium zinc oxide or metal oxides as described in Appl. Phys. Lett. 88, 123509 (2006) or WO2005112045, the contents of which are incorporated herein by reference; silicon inks Examples of crystalline inorganic semiconductors include group IV semiconductors such as silicon, germanium or the like; III-V semiconductor such as gallium arsenide, indium phosphide.

Examples of amorphous inorganic semiconductors include amorphous silicon.

Doping or control of carrier concentration can also be achieved using induced dipole effects as described in UK patent application no. GB819684.2, incorporated in its entirety by reference herein.

In certain embodiments, the semiconductive material is a precursor material, the method further comprising processing the patterned layer of semiconductive material to render the semiconductive material semiconducting.

In certain embodiments, the layer of compressible material comprises at least one compressible material selected from a list comprising polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate.

According to another aspect of the invention there is provided a method of manufacturing an electronic circuit comprising a plurality of electronic devices and a plurality of interconnections between the electronic devices in a single layer of semiconductive material, the method comprising:
  providing a layer of semiconductive material, and a layer of compressible material supporting the layer of semiconductive material; and
  patterning the layer of semiconductive material with a plurality of insulative features, each insulative feature being arranged to interrupt the layer of semiconductive material and the pattern of insulative features defining the electronic devices and interconnections,
  wherein said patterning comprises:
  forming each insulative feature by a method comprising displacing a respective selected portion of the layer of semiconductive material towards the compressible material so as to compress compressible material under each displaced portion and separate at least partly each displaced portion from undisplaced semiconductive material.

It will be appreciated that the electronic circuit manufactured in this way may be described as a substantially planar electronic circuit.

According to another aspect of the invention there is provided an electronic device comprising:
  a layer of semiconductive material;
  at least one insulative feature arranged to interrupt the layer of semiconductive material (e.g. so as to at least inhibit current flow across the feature); and
  a layer of compressible material arranged to support the layer of semiconductive material,
  wherein the or each insulative feature comprises a respective selected portion of semiconductive material from the layer of semiconductive material, the respective selected portion being separated at least partly from adjacent semiconductive material of (or in) the layer of semiconductive material.

According to another aspect of the invention there is provided an electronic circuit comprising, in a single layer of semiconductive material, a plurality of electronic devices and a plurality of interconnections between the electronic devices, and a layer of compressible material arranged to support the layer of semiconductive material, wherein the layer of semiconductive material is patterned with a plurality of insulative features, each insulative feature being arranged to interrupt the layer of semiconductive material and the pattern of insulative features defining the electrical devices and interconnections, and wherein each insulative feature comprises a respective selected portion of semiconductive material from the layer of semiconductive material, the respective selected portion being separated at least partly from adjacent semiconductive material of the layer of semiconductive material.

In certain embodiments, the or each respective selected portion is displaced from the layer of semiconductive material in a direction towards the compressible layer such that the compressible layer has a higher density under the or each selected portion than under the undisplaced portions of the layer of semiconductive material.

Another aspect of the invention provides an electronic device or electronic circuit manufactured using a method in accordance with any other aspect of the invention.

For example, certain embodiments provide a ZnO planar nano transistor, with an on/off ratio of approximately 300, formed from a substrate structure comprising: ZnO (10 nm)/PMMA (1000 nm)/SiO$_2$/Si.

It will be appreciated that certain embodiments of the present invention relate to methods for forming device templates suitable for post-processing into devices, such as electronic or photonic devices, by forming isolating regions in templates which have an active layer (of semiconductive material) supported on a carrier substrate. In particular, certain embodiments relate to the production of layered device templates with nanometre scale structures.

It is known to produce devices, such as individual electronic components or integrated circuits, from pre-forms which have a thin active layer, such as a semiconductor layer, supported on a carrier substrate. In electronic devices, regions of the active layer are modified into a device template by a variety of treatments in order to make them n-type semiconductor, p-type semiconductor, conductive, insulating, etc. For photonic devices, a nanostructure is typically formed via conventional nanolithography techniques.

For both electronic and for photonic device templates, it may be necessary to form regions which act as isolating areas between regions of active layer. This is also the case with templates for integrated circuit devices. Conventional methods for forming isolating areas involve a complex processing step such as electron beam lithography or ion bean lithography for each individual device template. This is time consuming when many device templates are to be formed to the same design.

As discussed above, U.S. Pat. No. 5,772,905 discloses a lithographic method and apparatus for creating nanometre scale patterns in a thin film coated onto a substrate. Protruding features on the mould create a recess in the thin film. The thin film is then subsequently processed to remove the material in the recesses, exposing the underlying substrate.

Hence there is a need for a method for forming isolating areas on device templates which is less complex and more rapid than prior art methods for mass production of device templates, and which can produce isolating areas in a device template in a single processing step.

According to another aspect of the invention there is provided a method for forming a device template from a pre-form comprising an active layer, of active layer semiconductive material, having an active layer thickness, supported on a carrier substrate wherein one or more isolating areas are provided in the active layer, characterized in that the isolating areas are apertures in the active layer formed by permanently displacing portions of the active layer material into a non-conductive layer between the insulating substrate and the active layer with a stamp having a base area and raised embossing areas having a height above the base area of the stamp which is greater than the active layer thickness whereby the embossing areas of the stamp displace portions of the active layer such that are no longer in contact with undisplaced active layer.

The method has the advantage that the design template for the device need only be etched once, into the stamp, and can subsequently be imprinted onto device templates by the simple and rapid method of repeatedly pressing, either by flat/stamp, step-and-move rotary or continuous roll-to-roll embossing, the embossed face of the stamp into pre-forms. The method also gives the advantage that the use of beams such as ion, electron or light, to perform lithography on each device template, is no longer needed. If, for instance, mechanical engraving is used for the production of the stamp, the minimum size of the features produced by the method of the invention need not be limited by beam resolution, as is the case with direct beam lithography technologies.

Certain methods embodying the invention also provide a device, formed from the device template resulting from the method. By device template is meant a patterned active layer carried on a carrier substrate which is suitable for subsequent further processing in order to form a device. The device template may also be usable at once, for instance if it is in the form of an optical grating produced by the method of the invention.

The device may comprise a plurality of interconnected components on the same carrier substrate. The method may be used to form a plurality of device templates on a single pre-form, such that a plurality of devices may be formed by post-processing the pre-form and separating it into individual devices.

Another aspect of the invention provides a device comprising an active layer, of semiconductive active layer material, having an active layer thickness, supported on a carrier substrate wherein one or more isolating areas are provided in the active layer, characterized in that the device comprises a non-conductive layer between the active layer and the carrier substrate wherein one or more displaced portions of active layer material are present in the non-conductive layer between the apertures in the active layer and the carrier substrate and that the displaced portions of active layer material are not in conductive contact with the active layer.

Further features of embodiments of the invention, detailed below, apply, where appropriate, to any of the above-mentioned aspects of the invention.

In certain embodiments the pre-form comprises an active layer of semiconductive material supported on a carrier substrate. The pre-form may also comprise other layers between the active layer and carrier substrate, or also on top of the carrier substrate. The active layer may be active at the time of carrying out the method of the invention, or may be a layer formed from a precursor material as the active layer material, which precursor material is subsequently processed to form an electrically semiconductive active layer, or the like. In other words, active layer refers to the ultimate use of the layer in the device to be formed from the device template generated by the method embodying the invention.

Certain embodiments of the invention involve the application of a stamp to the pre-form in order to emboss the pre-form. The stamp (which may also be described as an embossing tool) may have a base area and raised embossing areas having a height above the base area of the stamp which is greater than the active layer thickness such that when the stamp is pressed into the pre-form the embossing areas of the stamp displace portions of the active layer such that are no longer in contact with undisplaced active layer.

The embossing stamp may be in the form of a planar stamp such that the contact surfaces of the raised embossing area, which contact the pre-form in the method of the invention, are arranged in a common plane. The embossing stamp may be in the form of a cylindrical roller, with the contact surfaces of the raised embossing area arranged to be at the surface of a cylinder.

Alignment of the stamp with the pre-forms prior to pressing the stamp into the pre-forms may be carried out by conventional methods, such as optical registration. Optical markers, such as diffraction gratings, lines or holograms, can be easily integrated into the stamp during origination, e.g. using beam lithography.

In certain configurations for carrying out methods embodying the invention, the pre-form will be placed on a surface with the carrier substrate downwards and the active layer upwards, and the face of the embossing stamp having the raised embossing areas will be pressed into the pre-form, whilst that face of the embossing stamp is held substantially parallel to upper surface of the pre-form (or if the embossing stamp is in the form of a roller, the axis of the roller will be held substantially parallel to upper surface of the pre-form). The raised embossing areas will be pushed into the upper surface of the pre-form and will form apertures in the active layer by permanently displacing portions of the active layer material into a non-conductive layer between the insulating substrate and the active layer. The distance of penetration of the raised embossing areas into the pre-form will be determined either by a control means (such as a software programme operating on a computer) or may be limited by the base area of the embossing stamp contacting the upper surface of the pre-form. Conventional control methods (e.g. piezoelectric stepper) can be used to prevent the base area of the embossing stamp applying excessive pressure to the pre-form. The method could be carried out with the stamp and the pre-form oriented in other configurations, provided that the stamp contacts the pre-form on the side of the pre-form such that the active layer is between the embossing face of the stamp and the carrier substrate of the pre-form.

The stamp in certain embodiments is made of a corrosion resistant material such as nickel or a nickel cobalt alloy, titanium, steel, stainless-steel, silicon, brass, plastic (e.g. PDMS, PMMA, PB) and other materials well-known in the fields of nanoimprinting and, more particularly, origination and recombination for optical holographics. The stamp can also be coated with a hydrophobic layer, such as octadecyl-trichlorosilane (OTS) or trichloro(1H,1H,2H,2H-perfluorooctyl)silane (FOTS) or a fluoropolymer, to prevent adhesion of one or more materials from the pre-form on removal of the stamp after embossing.

For the production of a stamp, a latent image of the desired pattern of raised embossing areas on the stamp may be formed using conventional methods such as electron beam lithography, photolithography, focussed ion beam lithography, anode oxidation, etc. The latent image may then be developed, for instance by chemical etching, with the raised embossing areas corresponding to unetched surfaces, and the base area of the stamp being the bottoms of the etched areas. Another method for stamp production is mechanical engraving, for instance with a diamond-tipped tool. Stamp production can be achieved by origination of micro or nanofeatures, e.g. using e-beam lithography or focussed ion-beam lithography, to produce a master, typically in nickel but could also be silicon wafer. The master is kept securely and used to produce production shims by galvanoplastic replication. Recombination approaches (e.g. step-and-repeat) enable up-scale to larger shims for a range of production sizes to be generated.

The carrier substrate may be any suitable material for carrying layers, and can be rigid or flexible depending on application requirements. It may, for instance, be a layer of semiconductor such as silicon. Suitably, the carrier substrate is an electrically insulating layer, such as a semiconductor material which has been doped to convert it into an electrically insulating form. Another suitable material for the carrier substrate is flexible PET (polyethylene terephthalate). Another suitable material is silica (such as quartz or glass). Another suitable material is flexible metal, such as stainless-steel. Another suitable material is paper.

In certain embodiments there is a yielding layer (which may also be described as a compressible, or buffer layer) between the active layer and the carrier substrate and displacement of the portions of the active layer material is effected by compaction of the yielding layer by the raised embossing areas of the stamp.

For devices according to certain aspects of the invention, this will result in portions of yielding layer between the displaced portions of active layer and the carrier substrate which are in a compacted state whereby the displaced portions of active layer are no longer in conductive contact with the active layer.

By yielding layer is meant a layer which, when subjected to pressure above a certain value (known as the yield stress) deforms permanently, without returning to its original shape after the applied pressure is released.

The yielding layer may be a single layer of material, or may be made up of two or more substantially parallel layers of material. It may be appropriate for a plurality of yielding layers to be present, either in contact with each other, or with other layers sandwiched between them.

The yielding or compressible layer may comprise a deformable, or yielding polymer which could include polymethyl methacrylate, polyvinyl acetate, polyvinyl pyrrolidone, polyvinylphenol, and mixtures thereof. Such polymers yield when subjected to sufficient pressure, leading to collapse of the yielding layer, allowing the portions of active layer material to be punched out of the remaining active layer device template by the raised embossing areas of the stamp. The yield stress of the yielding layer (defined as the stress above which the yielding layer is permanently deformed after the stress is released) may be chosen by selection of polymer characteristics such as molecular weight. A suitable yield stress is from 0.01 to 50N/mm$^2$ preferably from 0.05 to 10N/mm$^2$ more preferably from 0.1 to 0.5 N/mm$^2$.

The yielding or compressible layer in certain embodiments is deposited onto the carrier (or backing or support) substrate (or layer) by solution-processing, such as spin-coating or dip-coating, but more preferably knife-coating or any other solution processing method that generate a homogeneous surface. The yielding layer may also be extruded. Substrates with pre-coated yielding layers can also be sourced commercially, such as from Dupont-Teijin Films.

In certain methods embodying the invention, the yielding layer is also the non-conductive layer. In this way, when a portion of active material from the active layer is pushed into the yielding layer by an embossing area of the stamp, it causes the yielding layer to deform below it, and remains positioned in the yielding layer, out of conductive contact with the remaining, undisturbed active layer.

Another configuration according to an embodiment of the invention has a pre-form with a non-conductive layer below the active layer and a yielding layer between the non-conductive layer and the carrier substrate. Other layers may be interposed or sandwiched between the specified layers. For this configuration, pressure from the raised embossing area punches a portion of active layer and a portion of non-conductive layer downwards and away from the remaining active layer. The yielding layer is compacted to allow for this displacement of the active layer and non-conducting layer. The embossing area penetrates into the pre-form a distance sufficient to displace the portion of active layer into the same level as the undisturbed non-conducting layer, such that it is no longer in conductive contact with the undisturbed active layer.

The active layer may be directly in contact with the yielding (compressible) layer or with the non-conductive layer, or there may be other intermediate layers situated between the active layer and the yielding and/or non-conductive layer. For instance, the yielding layer may first have a layer of self-assembling monomer deposited upon it (using silane based materials such octadecyltrichlorosilane (OTS), hexamethyldisilazane (HMDS) or perfluorooctyltrichlorosilane (FOTS) or mixtures of OTS/FOTS, OTS/HMDS, etc.)), for instance as a self-assembled monolayer (SAM), followed by deposition of the active layer. Such a layer is particularly advantageous to improve the mobility of organic semiconductors or, in the case of FOTS, to induce doping of the active layer at the interface between the active layer and SAM. Note that a SAM is not necessary to induce doping of the active layer. These other layers will be punched out of place, along with the regions of active layer that are punched into the non-conductive layer, by a method embodying the invention. It is important that each layer has good adhesion with the layer and/or substrate beneath. For instance, it is known that multiple layers of organic materials must be processed using orthogonal solvents such that each new deposition of a layer does not damage the preceding layer deposited beneath. To address this problem, the yielding layer may be cross-linked prior to deposition of other layers, using for example high-temperature or UV light, to improve adhesion with other layers including the SAM where used. One example of this is to use UV-crosslinkable copolymers, such as PMMA (*Optical Materials*, 23, (3-4), 583-592), which can be crosslinked prior to deposition of an active layer to minimise damage caused by subsequent solution-based deposition.

The active layer of semiconductive material may be doped or undoped. Organic semiconductor materials, for example, may be doped by the application of a self-assembled monolayer of FOTS below the active layer. Alternatively, organic semiconductor materials may be chemically doped or doped by intentionally introducing an oxygen-rich environment. Inorganic semiconductors may be chemically doped or deposited in conjunction with a suitable dopant, e.g. vapour co-deposition of inorganic semiconductor and dopant material.

A further layer or layers may be in place over the active layer of the template, for instance in order to protect the active layer from direct contact with the raised embossing areas of the stamp, or because it is needed for the final device, e.g. to provide additional isolation from the active layer. Such layers will be punched out of place, along with the regions of active layer that are punched into the non-conductive layer, by the method of the invention. Suitable materials for use in layers positioned over the active layer include insulating polymers such as PMMA and PVA, PVP.

It is desirable for the raised embossing area to have a height above the base area of the stamp such that portions of active layer displaced by the stamp are punched into the pre-form such that the upper surface of the displaced active layer is at a distance from the pre-form surface greater than the depth of the lower surface of the active layer (i.e. the surface of the active layer towards the carrying substrate). This ensures that the displaced portions of active layer are no longer in conductive contact with the undisplaced active layer.

The active layer may be any suitable active layer of semiconductive material for forming a device template. The active layer may be a conventional semiconductor such as a group IV semiconductor such as silicon, germanium or the like or it may be a III-V semiconductor such as gallium arsenide, indium phosphide or the like, or it may be an inorganic semiconductor such as zinc oxide or titanium dioxide, or it may be an organic semiconductor. Typically the active layer thickness will be 100 nm or less, preferably 50 nm or less more preferably 20 nm or less.

Characteristics of the active layer may be modified before or after the application of methods embodying the invention to provide isolating areas in the active layer, in order to further modify the device template. Completion of the device from the device template may not be necessary, or may take place after application of a method embodying the invention, and is referred to as post-processing. This may require further modification of the active layer, the application of further layers to the pre-form, the application of conductive contacts to the pre-form. These may all be achieved by methods know in the art. For instance the active layer may be photo-etched, solution patterned or annealed.

Suitable active layers include thin-films of semiconductor material that can suitably have been vacuum or vapour deposited (for instance pentacene) or sputter-coated (e.g. metal oxide layers), thin-films of semiconductor material that have been solution deposited (e.g. polyalkylthiophenes—P3HT, polyarylamine—PTAA, copolymers of fluorene and thiophene, soluble precursors of pentacene, silicon inks). The active layer may be in a form, when it is subjected to the method of the invention, such that if requires further processing before it is useful in a device. For instance, the active layer may be a thin film of precursor material (such as Diels-Alder product of pentacene pentachlorophenyl bridged-pentacene) that can be deposited (for instance by solution processing) and photopatterned or annealed to produce a semiconductor after deposition and an electronic device after processing by the method of the first aspect of the invention. For instance, following the formation of the device template by the method of the invention, a further layer or layers may be deposited onto or over the active layer, for instance a dielectric layer such as PMMA, PVP or high-k dielectrics such as nanocomposites for organic semiconductors or $SiO_2$ for inorganic and conventional semiconductors. High-k nanocomposite dielectric materials may require post-processing to planarise the pre-form. High-k dielectrics are dielectrics with a higher dielectric constant (k) than silicon dioxide.

In certain embodiments of the invention the semiconductive material (i.e. the active material) has a glass transition temperature. Suitably, the active layer material has a glass transition temperature from 30 to 200° C., preferably from 40 to 150° C., more preferably from 70 to 100° C.

The active layer may for instance be an organic semiconductor having a glass transition temperature, or a precursor for an organic semiconductor, wherein the precursor has a glass transition temperature.

When the active layer is such a material, a method for putting an aspect of the invention into effect may involve the active layer being heated to a temperature in excess of the glass transition temperature prior to forming the apertures (insulative features). This is suitably achieved by heating the pre-form prior to application of the embossing stamp to the pre-form.

It has been found that heating the active layer to a temperature in excess of its glass transition temperature leads to an improvement in the cleanness of the edges of apertures formed in the active layer, minimising any smearing or transfer of material.

Another method for putting an aspect of the invention into effect has the active layer at a temperature less than the glass transition temperature immediately prior to forming the apertures, and the stamp at a temperature greater than the glass transition temperature immediately prior to forming the apertures.

This method also leads to an improvement in the cleanness of the aperture edges, minimising any smearing or transfer of material, but without any risk of degradation to the active layer, or to other layers of the pre-form, which may be caused by heating the pre-form. A further advantage of this method is that the heated stamp can convert the displaced active layer into an insulating state, thereby improving the isolation with the undisturbed active layer.

Certain methods embodying the invention are applicable to device templates which are intended for an electronic or photonic device. The apertures formed in the active layer of the device template by the method may typically be small apertures, having dimensions in the range 20 to 1000 nm, or 100 to 300 nm. However, methods embodying the invention may also be used to form larger apertures (having dimensions of 10 micrometres or more). This may be particularly advantageous compared to direct beam lithography to form large apertures in devices or device templates, as each part of an isolating area will need to be written by the beam used, leading to long processing times.

Certain methods embodying the invention are particularly suitable when the device template is for a planar nanoelectronic diode, transistor or circuit (a so-called self-gating Device), particularly for devices such as described in WO 2002/086973 and WO 2006/120414. Such devices, as detailed in WO 2002/086973, comprise electronic circuit component comprising a substrate supporting mobile charge carriers, insulative features formed on the substrate surface to define first and second substrate areas on either side of the insulative features, the insulative features including first and second regions which are positioned close to one another but spaced apart so as to provide an elongate channel, which provides a charge carrier flow path in the substrate from the first area to the second area, and wherein said elongate channel is dimensioned and arranged such that the parameters of the charge carrier flow path are dependent on a potential difference between said first and second areas. In WO 2006/120414, electronic devices are described comprising a substrate supporting mobile charge carriers (or in this case the active layer), insulative features formed on the substrate surface (i.e. embossed within the active layer) to define first and second substrate areas on either side of the insulative features, the first and second substrate areas being connected by an elongate channel defined by the insulative features, the channel providing a charge carrier flow path in the substrate from the first area to the second area, the conductivity between the first and second substrate areas being dependent upon the potential difference between the areas, wherein the mobile charge carriers can be within at least two modes in each of the three dimensions within the substrate. In each case, the insulative features are suitably formed within the active layer, using the method of the invention, creating diodes, diode arrays, transistors, transistor arrays or circuit elements combining many diodes and/or transistors.

BRIEF DESCRIPTION OF THE DRAWINGS

Embodiments of the invention will now be described with reference to the accompanying drawings, of which:

FIGS. 3a and 3b illustrate the formation of an insulative feature in another embodiment of the invention;

FIG. 4 is a schematic cross section or part of an electronic device embodying the invention;

FIG. 5 is a schematic cross section of part of another electronic device embodying the invention;

FIG. 6 is a schematic cross section of yet another electronic device embodying the invention;

FIG. 31A is a cross section through a stamp and a device pre-form according to an embodiment of the invention, FIG. 31B is a cross section through a device template prepared in accordance with the embodiment of the invention of FIG. 31A, FIG. 32A is a cross section through a stamp and a device pre-form according to a another embodiment of the invention, FIG. 32B is a cross section through a device template prepared in accordance with an embodiment of the invention.

DETAILED DESCRIPTION OF EMBODIMENTS OF THE INVENTION

Figure 1A:
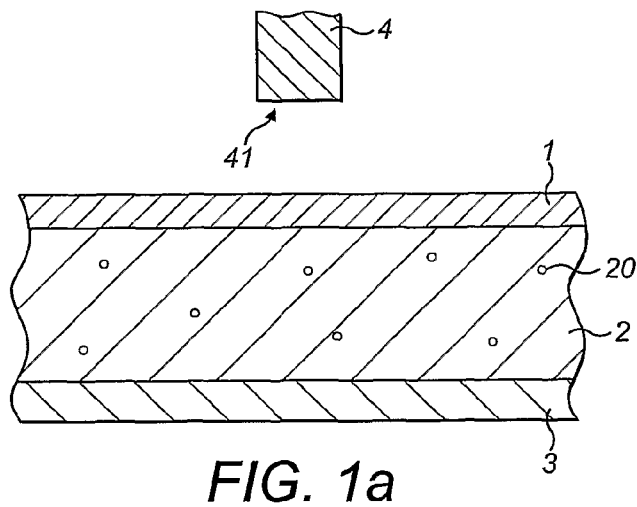
FIGS. 1a, 1b and 1c illustrate steps in a method of manufacturing an electronic device in accordance with the present invention.
Figure 1B:
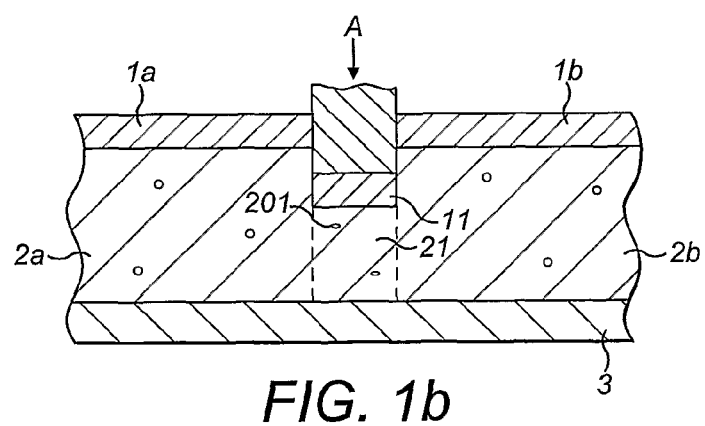
Figure 1C:
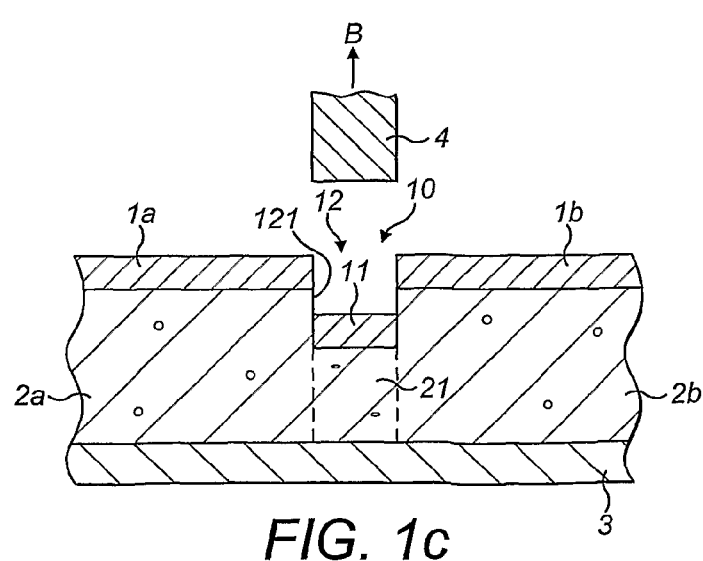

Referring now to FIGS. 1a-1c, in a first method embodying the invention a layer of semiconductive material 1 is provided, supported by a layer 2 of insulative and compressible material.

The insulative layer 2 is itself supported by an underlying substrate layer 3, in this example formed of substantially non-compressible material. The semiconductive layer 1, compressible layer 2, and substrate or backing layer 3 can together be described as forming a multi-layer device substrate. It will be appreciated that a wide variety of techniques known in the art may be used to fabricate such a multi-layer structure, and embodiments of the invention may utilise any suitable such techniques, for example techniques selected to suit the particular material or materials of each layer. In certain embodiments, for example, the semiconductive layer 1 is a layer of organic semiconductive material, which may be formed over the compressible layer by spin-coating. In this first example, the material of the compressible layer 2 is porous, that is comprising a plurality of pores 20, and having an initial porosity. FIG. 1a shows an embossing tool 4 having an embossing surface 41 and arranged over the semiconductive layer 1 to be patterned, ready to form an insulative feature. FIG. 1b illustrates a subsequent step in the manufacturing method, in which the embossing tool 4 has been moved in a direction generally towards the compressible layer 2 (and hence towards the backing layer 3), that direction being generally indicated by arrow A. In making this movement, the embossing surface 41 has engaged a corresponding portion of the upper surface of the semiconductive layer 1, and has driven a selected portion 11 of the layer of semiconductive material 11 downward, out of the plane of the initial layer 1, and compressing a portion 21 of the compressible material beneath it. This compression has formed compressed pores 201 in the portion 21, and it will be appreciated that compressed portion 21 has a reduced porosity and increased density compared with uncompressed portions 2a and 2b. In this example, this displacement of the selected portion 11 of semiconductive material has completely separated it from undisplaced portions 1a, 1b of the semiconductive layer 1. FIG. 1c shows another subsequent step in the manufacturing method, in which the embossing tool 4 has been withdrawn, in direction shown by arrow B, leaving the displaced portion 11 of semiconductive material at the bottom of a depression or trench 12 formed in the upper surface of the device substrate. The material of the compressible layer 2 in this example is such that the compression of the portion 21 is substantially irreversible, such that there is substantially no return of the portion 21 to its original dimensions. In other words, the compressible material 2 has been arranged to yield under the force applied via the embossing tool, and remains in its compressed state. In this example, the side walls 121 of the trench 12 comprise exposed portions of the layer of insulative, compressible material 2 such that the insulative feature 10 formed by the embossing tool 4 (and which comprises the trench and displaced portion 11 of semiconductive material) forms a substantially complete electrical block to current flow in the semiconductive layer 1 across the feature 10.

Figure 2A:
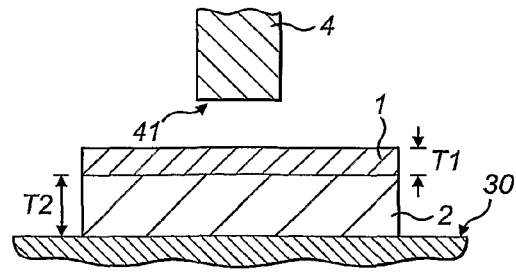
FIGS. 2a-2e illustrate the formation of insulative features in another method embodying the invention.
Figure 2B:
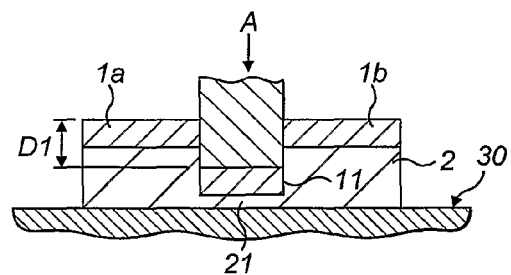

Referring now to FIGS. 2a-2e, in another method embodying the invention a device multi-layer substrate comprises a layer of semiconductive material 1 formed on a layer of compressible material 2 without any incompressible backing layer or layers. Instead, during the patterning process to produce insulative features the device substrate is temporarily supported on a support surface 30, which in this example is flat. The semiconductive layer has been formed to have a substantially uniform thickness T1, and the compressible material has been formed so as to have a substantially uniform thickness T2. Again, an embossing tool 4 having an embossing surface 41 is arranged to produce insulative features by a stamping process alone, i.e. by movement solely in a direction substantially perpendicular to the flat support surface 30. FIG. 2a shows the embossing tool 4 positioned ready to emboss the device substrate. FIG. 2b shows a subsequent point in the manufacturing process, at which the embossing tool 4 has been urged towards the support surface 30 in the direction shown by arrow A so as to press and displace the selected portion 11 of semiconductive material from the layer 1 towards the support surface 30, compressing a portion 21 of the compressible material beneath it. In this example, the embossing tool 4 has been used to displace the portion 11 initially by a distance D1, where D1 is greater than T1, and less than T2.

Figure 2C:
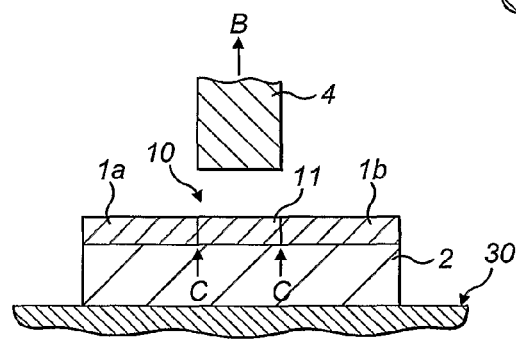

FIG. 2c shows a subsequent step in the method where the compressible material used to support the semiconductive layer is so resilient that it substantially returns to its original shape when the embossing tool 4 is withdrawn in the direction shown by arrow B. The portion of semiconductive layer 11 initially displaced by the tool 4 has also substantially returned to its original position, in the layer of semiconductive material 1 and substantially co-planar with the undisplaced portions 1a, 1b. However, the earlier displacing operation has produced discontinuities C (which may be in the form of cracks, cuts, faults, or other such features) which at least partially define and separate the "displaced" portion 11 from the undisplaced semiconductive material. These discontinuities (brakes, cuts, etc) C at least inhibit, and in some embodiments will completely prevent, the flow of current in the layer 1 from an undisplaced portion 1a on one side of the displaced portion 11, to an undisplaced portion 1b on the other side. Thus, even though the portion 11 has returned substantially to its original position, the embossing process has still produced an insulated feature 10, that feature comprising the displaced and returned portion 11, but also the discontinuities C on either side.

Figure 2D:
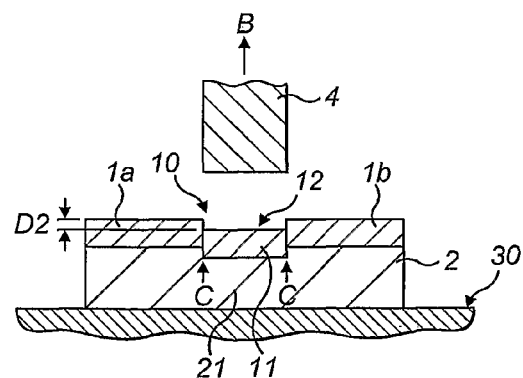

FIG. 2d illustrates an alternative subsequent step in the manufacturing method, following the steps shown in FIGS. 2a and 2b, but where the compressible material 2 has been selected so as to be partially resilient. In other words, the compression of the portion 21 has been arranged such that the resultant deformation of the compressible material has included both a reversible component and an irreversible component (which may also be described as a yielding component, an inelastic deformation, or a plastic deformation). FIG. 2d illustrates again the situation where the embossing tool 4 has been withdrawn. The compression portion 21 has partly regained its original shape, but not completely. As a result, displaced portion 11 remains partly offset from the undisplaced portion 1a and 1b of the semiconductive layer, forming the base of a trench or depression 12 in the upper surface of the device. Although there is some overlap between the sides of the displaced portion 11 and undisplaced portion 1a, 1b (because the final depth of the depression D2 is less than the thickness T1 of the semiconductive layer in this example) the embossing has still produced an insulative feature 10, interrupting current flow in the undisplaced semiconductive layer at least by virtue of the cracks or other discontinuities C formed by the initial full displacement of the portion 11 out of the layer 1.

Figure 2E:
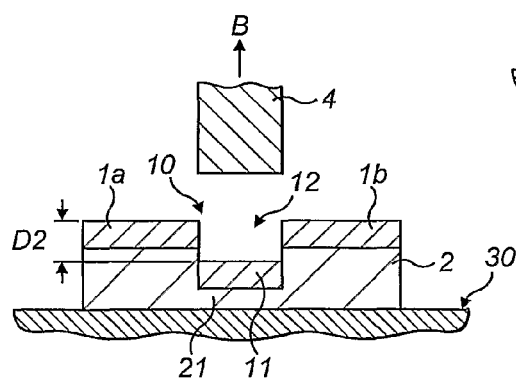

Moving on to FIG. 2e, this shows yet another step subsequent to those shown in FIGS. 2a and 2b, this time where the compressible material 2 has been selected so as to be only slightly resilient after removal of the embossing tool 4. In other words, the material 2 and the degree of depression by the embossing tool 4 has been chosen such that the deformation of the portion of compressible material under selected portion 11 is substantially irreversible. Thus, when the embossing force is removed, the compressed portion makes only a small return towards its original shape, leaving portion 11 permanently displaced a distance D2 below the upper surface of the semiconductive layer, where D2 is greater than T1. An advantage of forming such a permanent displacement is that the insulative properties of the resultant insulative feature 10 can be improved, in as much as the insulative feature 10 forms a more complete barrier or interruption to current flow in the semiconductive layer 1.

Referring now to FIGS. 3a and 3b, in another method embodying the invention the embossing tool 4 does not make contact directly with the layer of semiconductive material 1. Instead, an additional layer of insulative material 5 is provided over the semiconductive layer, which is supported by the compressible layer 2 and then the substantially incompressible backing layer 3. The embossing tool 4 is then moved in the direction shown generally by arrow A so as to dry selected portions 11 of semiconductive material, and corresponding portions 51 of the insulative layer, down towards the support layer 3, compressing compressible material beneath. Advantageously, the insulative material 5 covering the semiconductor layer 1 can be selected for its anti-adhesion properties, that is it can be selected so that it is reluctant to adhere to the embossing surface 41 of the embossing tool 4. The covering layer 5 may thus be selected to provide a low-adhesion, or non-stick "barrier" between the embossing tool and the semiconductive material 11, for use when the semiconductive material itself may otherwise have tended to stick to the embossing surface 41 and so hinder the formation of well defined insulative features during the embossing process. Although in the figures the insulative material 5 and layer of semiconductive material 1 are both shown to be substantially non-compressible, in alternative embodiments the semiconductive layer 1 may be compressible, at least to a certain degree, as may be any covering or capping layer 5.

Moving on to FIG. 4, this shows part of an electronic device embodying the invention. The figure shows an insulative feature 10 formed in the device substrate which is a multi-layer structure comprising a layer of semiconductive material 1 supported by a multi-layer compressible structure 202, which is itself supported on a substantially non-compressible backing layer or base layer 3. The multi-layer compressible structure 202 comprises an upper layer 2 of compressible material and a lower layer 200 of compressible material. Thus, in this example each of the component layers of structure 202 are themselves compressible, and they may compress to differing degrees or the same degree under the action of a compressive force. The insulative feature 10 formed in the device substrate comprises a trench 12 having side walls which comprise exposed portions of the upper layer 2 of compressible material (which in this example is insulative), and the base of the trench 12 is defined by a portion 11 of semiconductive material that has been displaced from the layer 1 so as to be completely electrically separated from undisplaced portions 1a, 1b on either side of the trench 12. Beneath the displaced portion 11 are located compressed portions 21 and 201 of the upper and lower compressible layers respectively.

Referring now to FIG. 5, this shows part of a device substrate part way through the manufacture of an electronic device from the substrate. The device substrate comprises a layer of semiconductive material 1 supported by a layer of compressible material 2, itself formed over a multilayer backing structure comprising a first support layer 31 and a second support layer 32. An insulative feature 10 has been formed by displacing a portion 11 of the super conductive layer down into the compressible layer 2, compressing a portion 21 beneath it. However, the method has been such that portions of semiconductive material 101 coat the side walls of the trench 12 formed by this displacement. These portions 101 provide some electrical conductivity, albeit reduced, across the insulative feature 10. In certain embodiments, the reduction in conductivity formed by producing these thinner regions 101 on the side walls of the trench 12 may be sufficient, depending on the required function of the insulative feature in the eventual device. However, in alternative embodiments, the insulative feature 10 may undergo further processing to remove these portions 101 such that the displaced portion 11 is completely electrically isolated from undisplaced portions 1a and 1b. In the example shown in FIG. 5, the compressible material 2 is not porous, although it is of course compressible so that its density under the displaced portion 11 (i.e. the density of the compressed portion 21) is greater than under the undisplaced portions.

Referring now to FIG. 6, this shows part of an electronic device embodying the invention and manufactured using a method also embodying the invention. The device comprises a layer of semiconductive material 1 supported by a layer of compressible material 2, which in this example is porous. A backing layer 3 supports the compressible layer 2. An insulative feature interrupts the semiconductive layer, separating portions 1a and 1b on either side of the feature, that feature comprising a trench filled with insulative material 120 and having a base defined by a portion 11 of semiconductive material that has been displaced from the layer 1. Beneath the insulative feature a portion 21 of the compressible layer has a reduced porosity compared with that of relatively uncompressed portions 2a and 2b under the undisplaced portions of the semiconductive layer 1. An insulative layer 5 has been formed over the semiconductive layer and filled trench.

Figure 7:
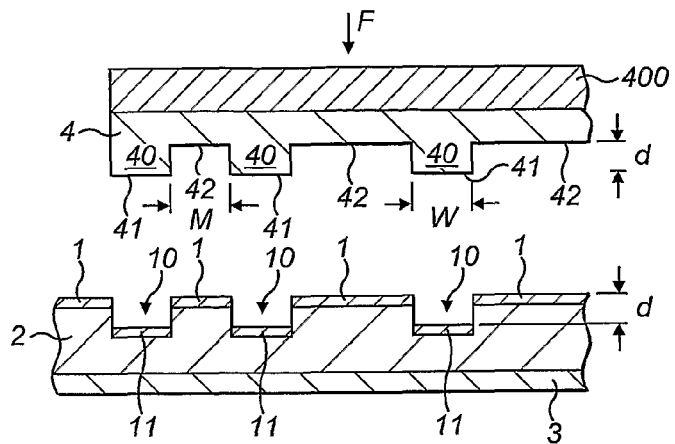
FIG. 7 is a schematic representation of part of an electronic device embodying the invention and embossing apparatus used to pattern the device.

Referring now to FIG. 7, embossing apparatus used in another method embodying the invention comprises an embossing tool 4 which comprises a plurality of embossing features 40, each embossing feature comprising a respective embossing surface 41 raised (i.e. protruding) a distance d from a base surface 42. In this example the embossing tool 4 is supported on an embossing support 400 such that the base surface 42 is substantially planar, and is substantially parallel to the layer of semiconductive material 1 in a device substrate. In order to pattern the semiconductive layer 1a force F is applied to the support 400 so as to urge the embossing features 40 into the multi-layer device substrate, such that each embossing surface 41 drives a corresponding portion 11 of the semiconductive material from the layer 1 down into the compressible layer 2, towards the backing layer 3. Thus, the pattern of insulative features 10 produced in the layer of semiconductive material 1 corresponds to the pattern of embossing features 40 on the embossing tool 4. In this example, each of the embossing features have substantially the same width W, that width corresponding to the width of each embossing surface 41. The minimum separation between adjacent insulative features 40 in this example is denoted by M, and M is substantially equal to W.

Figure 8:
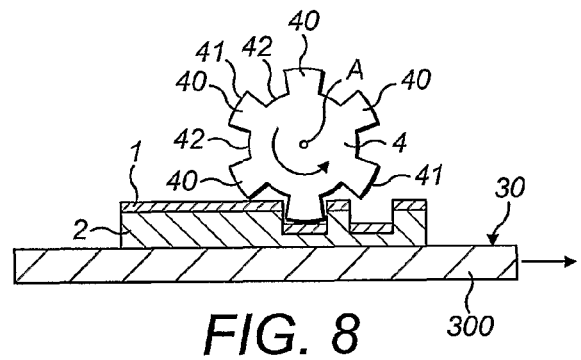
FIG. 8 is a schematic representation of alternative embossing apparatus being used to pattern a layer of semiconductive material in a method embodying the invention.

Referring now to FIG. 8, this illustrates the patterning of a layer of semiconductive material with insulative features in another method embodying the invention. Here the embossing tool 4 is generally cylindrical, arranged to rotate about a longitudinal axis A, and having a generally cylindrical base surface 42 from which each insulative feature 40 protrudes, defining an outer embossing surface 41. A device substrate comprising a semiconductive layer 1 supported by a layer of compressible material 4 is supported on a flat support surface 30 of a moveable support or bed 300. This bed 300 is translated in the direction shown by the straight arrow in the figure as the embossing tool is rotated about axis A, thereby allowing each embossing feature 40 to produce its corresponding insulative feature in the device substrate as that substrate passes beneath the roller. Such apparatus and method is suitable for the rapid and large scale patterning of substrates to form devices and circuits, as will be readily appreciated.

Figure 9:
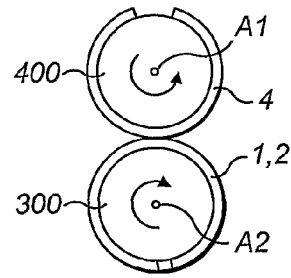
FIG. 9 is a schematic representation of yet further embossing apparatus being used to pattern a layer of semiconductive material in a method embodying the invention.

Moving on to FIG. 9, in this example the embossing tool 4 is substantially flexible, and has been mounted on a cylindrical support roller 400 arranged to rotate about a first longitudinal axis A1. Similarly, the device substrate to be patterned, and comprising the layer of semiconductive material and compressible layer 2 has been mounted on a support roller 300 arranged to rotate about axis A2 which is parallel to axis A1. The size of the embossing features on the tool 4 is so small that they have not been represented on the figure. Similarly, the structure of the device substrate is now shown on the figure to maintain its clarity. However, it will be appreciated that a wide variety of forms for the device substrate may be supported on the roller 300 and patterned in this way. For example the layer of semiconductive material may be just one layer of a multi-layer semiconductive structure, the compressible layer may be a layer of a multi-layer compressible structure, and the device substrate may additionally comprise one or more backing, support, or base layers and one or more capping, covering or overlying layers above the semiconductive material.

Figure 10:
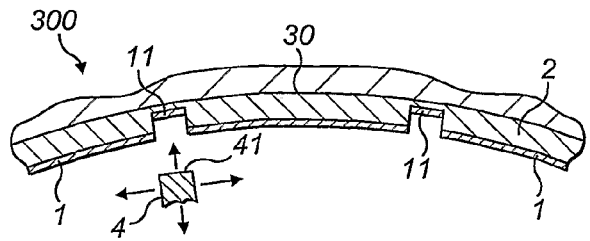
FIG. 10 is a schematic representation of embossing apparatus and a device substrate in another method embodying the invention.

Moving on to FIG. 10, this shows yet another arrangement of components in a method embodying the invention. Here the device substrate comprising the semiconductive layer 1 and compressible layer 2 is substantially flexible, and has been supported on the concave supporting surface 30 of a support member 300. An embossing tool 4 having an embossing surface 41 has been moved with respect to the device substrate and support surface 30 so as to create indentations in the semiconductive layer, thereby producing insulative features. Each indentation comprises a respective portion 11 of semiconductive material pressed into the compressible layer by the tool 4. In contrast to embodiments where an extensive embossing tool comprising a plurality of insulative features is used to pattern the semiconductive layer, in this example the embossing surface is relatively small, and a large pattern of insulative features is produced by translating the embossing tool 4 to different positions above the semiconductive layer before pressing to displace portions 11.

Figure 11:
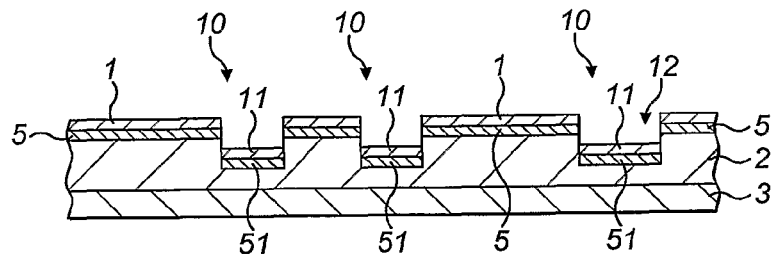
FIG. 11 is a schematic cross section of part of an electronic device embodying the invention.

Referring now to FIG. 11, this shows part of an electronic device embodying the invention. The device comprises a semiconductive layer 1 patterned by a plurality of insulative features 10. The semiconductive layer is supported by a layer of compressible material 2, but not directly; instead there is a layer of insulative material 5 arranged between the semiconductive 1 and compressible 2 layers. The compressible layer 2 is itself supported by a backing support or substrate 3. Each insulative feature 10 comprising a trench 12 formed by displacing a respective portion 11 of semiconductive material and a corresponding portion 51 of separating layer material down towards the support 3, thereby compressing compressible material 2 underneath. Advantageously, by having this intermediate layer 5 between the semiconductive layer 1 and compressible layer 2, the process engineer is provided with more options to overcome material incompatibility problems. For example, use of the intermediate layer 5 may enable the device to incorporate semiconductive material 1 which would not adhere well directly to the compressible material 2. The compressible material 5 may be selected to be a material to which both the semiconductive layer 1 and compressible material 2 adhere well to.

Figure 12:
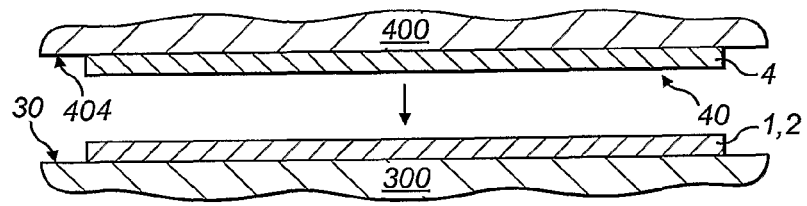
FIG. 12 is a schematic representation of an embossing tool in the form of a stamp or shim, arranged to pattern a layer of semiconductive material in an embodiment of the invention.

Referring now to FIG. 12, this shows apparatus involved in the manufacture of an electronic circuit embodying the invention. Here, a relatively large and extensive device substrate comprising at least one layer of semiconductive material and at least one layer of compressible material 2 supporting the semiconductive layer is flexible but supported on the flat support surface 30 of a rigid support member or table 300. Positioned with respect to the device substrate is an extensive embossing tool 40 in the form of a stamp or shim having a facing surface provided with a plurality of embossing features 42 on the nanometre scale. These features are too small to be shown in detail on the figure, but their location is indicated generally by arrow 42. The stamp or shim is itself flexible, and is supported on a substantially flat support surface 404 of a support member or assembly 400. In order to pattern the device substrate the shim or stamp is forced into contact with the device substrate, so that each embossing feature penetrates the surface to a depth which brings the base surface of the embossing tool into contact with the "upper" surface of the device substrate (be that a surface of a semiconductive layer, or some other layer provided between the semiconductive layer and the shim). The force with which the shim is pressed against the device substrate may be controlled, as may be the length of time for which the two are in contact. The shim is then withdrawn. In this way, the pattern of embossing features on the shim is transferred to the layer of semiconductive material in a single step. Thus, in embodiments where the shim comprises features defining a plurality of devices, or indeed part or all of one or more complete electronic circuits, these features can all be transferred to the semiconductive layer in a single embossing or stamping step. In certain embodiments, such a single step can be used to pattern an entire electronic circuit in the semiconductive layer of the device substrate.

Figure 13:
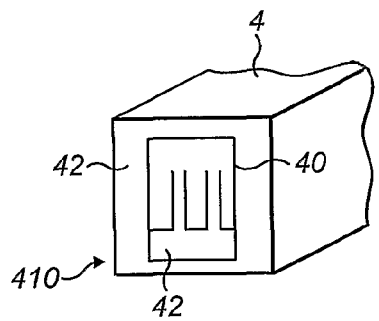
FIG. 13 is a schematic representation of part of an embossing tool used in embodiments of the invention, the tool having an embossing surface provided with a raised pattern for producing corresponding insulative features in a semiconductive layer to define a complete electronic device.

Referring now to FIG. 13, this shows an embossing tool which may also be described as an embossing head, and which may be used in methods embodying the invention. The embossing head 4 has an end surface 410 comprising a base surface 42 and a plurality of embossing features 40 raised above (i.e. protruding from) the base surface 42. In this example the embossing features 40 are arranged in a pattern to define a complete electronic device such that when the embossing tool is used to pattern a semiconductive layer supported by a compressible layer, the resultant pattern of insulative features in the semiconductive layer enables the patterned semiconductive layer to function as the device without requiring further processing. In this particular example, the pattern of embossing features 40 is arranged to define a diode in a semiconductive layer, that diode comprising a pair of elongate semiconductive channels defined by an asymmetrical arrangement of insulative features, each channel connecting a first, undisplaced portion of semiconductive material to a second undisplaced portion. It will be appreciated that although the embossing head of FIG. 13 is patterned so as to be able to produce a diode in a single stamping operation on a semiconductive substrate, embodiments of the invention are able to use differently patterned embossing heads, to produce other devices in a single stamping operation as required.

Figure 14:
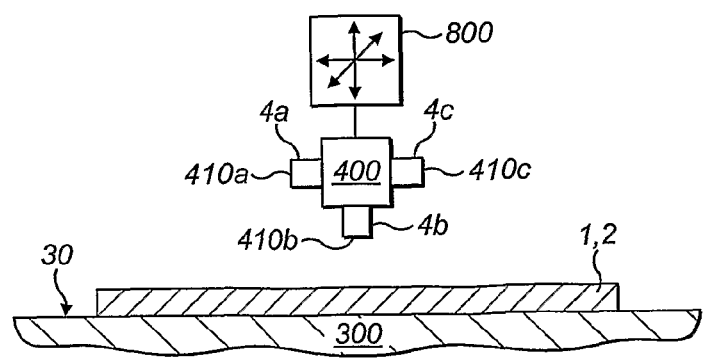
FIG. 14 is a schematic representation of embossing apparatus used in another method of manufacturing electronic devices and embodying the invention.

Referring now to FIG. 14, this is a highly schematic representation of embossing apparatus embodying the invention and which may be used in methods embodying the invention to produce electronic devices and circuits themselves embodying the invention. The apparatus comprises a plurality of embossing heads 4a, 4b, 4c each having a respective end surface 410a, b, c provided with a pattern of embossing features suitable for defining a complete, single respective device in the semiconductive layer of a device substrate in a single stamping operation. The embossing heads 4a, b, c are all supported on a head support 400 which is operable to position a selected one of the heads over a device substrate to be processed. In other words, the apparatus is operable to bring different embossing heads into position over the device substrate in order to stamp patterns defining different devices into the semiconductive layer at different positions on the device substrate and so build up at least part of an electronic circuit, if desired. Although not shown in the figure, in certain embodiments the embossing head support 400 may also be adapted to support one or more additional heads suitable for use in embossing features in the device substrate to define connections between devices, between devices and supply rails, between devices and terminals, or indeed between any circuit components as required in order to produce a fully functioning circuit in the single layer of semiconducting material. The head support 400 in this example is rotatable to bring different heads into position over the substrate. The head support 400 is itself connected to a support structure 800 which is able to translate the head support with respect to the device substrate 1, 2 supported on the support surface 30 of a table 300 in any one of three dimensions. Thus, the support assembly 800 can be operated to bring a selected embossing head 4a, b, c into position over any selected portion of the device substrate, and additionally may be operated so as to stamp the device substrate using the selected embossing head. It will be appreciated that the apparatus of FIG. 14 represents an alternative way of producing a plurality of components, or indeed an electronic circuit on an extensive substrate, as compared to the technique illustrated in FIG. 12 where the embossing tool is itself patterned to define the whole array of devices and/or their interconnections.

It will be appreciated that although FIG. 13 and FIG. 14 show embossing heads each provided with embossing features defining just a single device, in alternative embodiments a single embossing head may be provided with embossing features to define a plurality of devices and/or defining complete electronic circuits.

Figure 15:
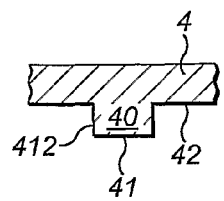
FIGS. 15-17 are schematic cross sections of different embossing features of embossing tools used in methods embodying the invention.
Figure 16:
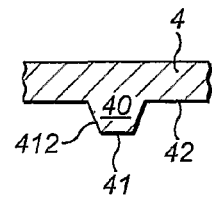

In certain embodiments, one or more (or indeed all) of the embossing features provided on the embossing tool may be substantially rectangular in cross section, having a flat end, embossing surface 41 connected to the base surface 42 by side surfaces 412 substantially perpendicular to the base surface 42. Such an arrangement is shown in FIG. 15. However, different embodiments may employ one or more embossing features having different shapes. For example, one such alternative shape is shown in FIG. 16, wherein the embossing surface 41 is substantially flat, but is connected to the base surface 42 by sloping side walls 412 such that the embossing feature 40 tapers inwardly from its base towards its tip.

Figure 17:
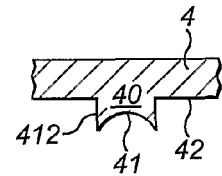

FIG. 17 shows another alternative shape of embossing feature which may be used in embodiments of the invention. Here the embossing surface 41 is concave, connected by side walls 412 which are again substantially perpendicular to the base surface 42.

Figure 18:
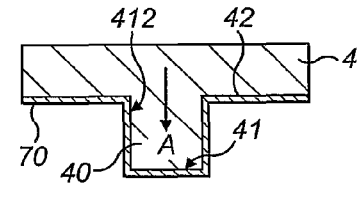
FIG. 18 is a schematic representation of an embossing tool arranged to produce an insulative feature in a device substrate in another method embodying the invention.

Referring now to FIG. 18, this illustrates part of another method of manufacturing an electronic device embodying the invention. Here, before the embossing tool 4 is used to produce an insulative feature in the device substrate comprising the semiconductive layer 1 and the compressible layer 2, the embossing tool 4 is coated with a layer of material 70. This material coats the embossing surface 41, the base surface 42, and the side walls of each embossing feature 40 in this example. This coating 70 may be a material selected to prevent or reduce/inhibit adhesion between the embossing tool and the semiconductive material 1. Coating the embossing tool in this way before using it to pattern the device substrate enables better defined insulative features to be formed, thereby improving the reliability of the process in producing working devices.

Figure 19:
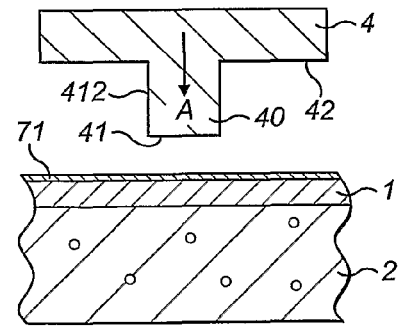
FIG. 19 is a schematic representation of another embossing tool arranged to pattern the semiconductive layer of an electronic device in another method embodying the invention.

FIG. 19 illustrates an alternative technique in which rather than coating the embossing tool 4 with a non-stick material, the semiconductive layer 1 itself is provided with a non-stick or adhesion reducing coating or layer 71 prior to embossing.

Figure 20:
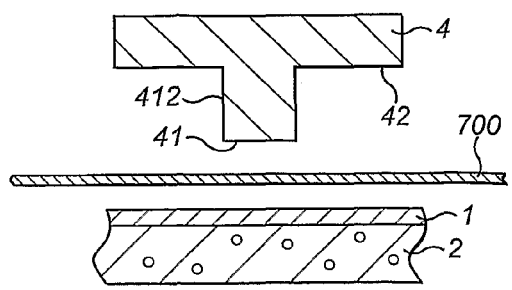
FIG. 20 is a schematic representation of an embossing tool arranged to emboss a semiconductive layer via an intermediate layer or film in another method embodying the invention.

FIG. 20 represents yet another technique for preventing or reducing adhesion between the embossing tool 4 and the device substrate (and in particular the semiconductive layer 1). Here, a separating film or membrane 700 is provided between the embossing tool 4 and device substrate such that during the subsequent stamping operation, the semiconductive layer 1 is embossed through (i.e. via) the film or membrane 700. Depending on the materials being used and device requirements the film or membrane 700 may be left in place on the patterned device substrate, or may be removed.

Figure 21:
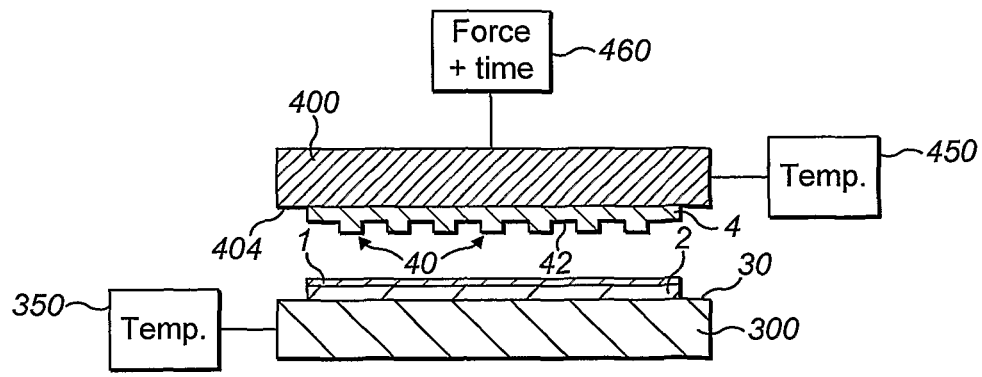
FIG. 21 is a schematic representation of embossing apparatus and substrate support apparatus used in methods of manufacturing electronic devices and circuits embodying the invention.

Referring now to FIG. 21, this shows in highly schematic form embossing apparatus embodying the invention and suitable for carrying out methods embodying the invention. Here, the device substrate comprising a semiconductive layer 1 supported by a compressible layer 2 is itself supported on the surface 30 of a rigid support 300 connected to a support temperature controller 350. This controller 350 is adapted to control a temperature of the support 300 and in turn the temperature of the semiconductive and compressible layers 1, 2. The controller 350 is operable to set a desired temperature of the support 300 before commencing an embossing operation. In certain embodiments the temperature controller 350 is further arranged to control the temperature of the support 300 while the embossing process is taking place (i.e. while the embossing tool 4 is in contact with the device substrate). The controller 350 can be used to alter the temperature of the support 300 during the embossing process, and indeed change the temperature of the support 300 during embossing, before the embossing tool 4 is separate from the device substrate. The apparatus also comprises an embossing tool 4 provided with a pattern of embossing features 40 raised above a base surface 42. The embossing tool (stamp or shim) is rigidly supported on the surface 404 of a stamp support 400. This support 400 is connected to a temperature controller 450 which, like the temperature controller 350 for the support 300, is adapted to set, control and optionally adjust a temperature of the stamp support 400 before and/or during the embossing process, and indeed to control (e.g. maintain constant, or change) a temperature of the shim support 400, and thereby the temperature of the shim (embossing tool) 4 itself before the shim is withdrawn from the device substrate to leave the desired pattern imprinted thereon. The apparatus additionally comprises a force and time control means 460 connected to the shim support 400 and operable to control both the force with which the embossing tool 4 is pressed against the device substrate and the time for which that force is applied (in other words, the controller 460 is operable to determine the duration of the imprinting process). It will be appreciated that the apparatus of FIG. 21 provides a wide range of operational flexibility, and various parameters of the embossing process can be controlled to improve or optimise results. These parameters include the embossing force (which may be held constant, or modulated in some way, for example by pulsing the applied force), the duration of the embossing process, the temperature of the embossing tool (before and during contact with the device substrate, and before withdrawal) and the temperature of the device substrate support 300 (before and during the imprinting process, and before withdrawal of the imprinting tool). The apparatus of FIG. 21 can therefore be used to implement methods embodying the invention and described elsewhere in this specification.

Figure 22:
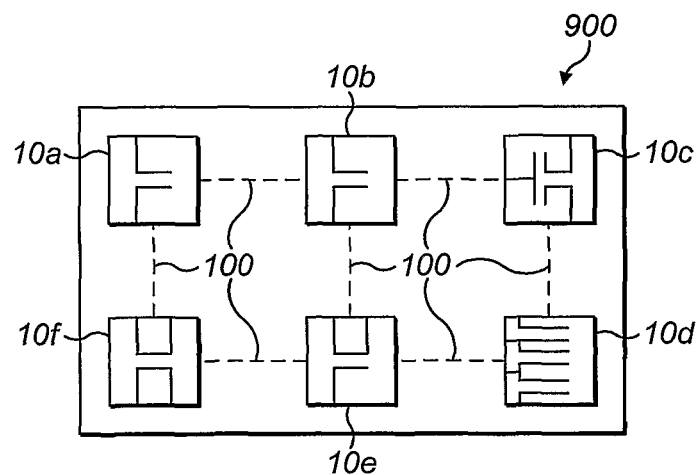
FIG. 22 is a schematic representation of an electronic circuit embodying the invention.

Referring now to FIG. 22, this is a highly schematic representation of an electronic circuit 900 embodying the invention, that circuit comprising a plurality of electronic devices and their interconnections formed in a single layer of semiconductive material. Each device is defined by a corresponding pattern or array of insulative features 10a-10d formed in the layer of semiconductive material, which is supported, either directly or indirectly by a layer of compressible material. In the highly schematic illustrated example, insulative feature patterns 10a and 10b each define respective diodes (in other words, each pattern defines a portion of the semiconductive substrate which functions as a diode). Insulative feature pattern 10c defines a logic OR gate. Insulative feature pattern 10d defines an AND gate. Insulative feature pattern 10e defined a general diode structure but with an additional side gate so as to provide a diode with a tunable threshold. Insulative feature pattern 10f defines a field effect transistor.

It will be appreciated that the circuit 900 shown in FIG. 22 may conveniently be manufactured using a single patterning step in which the semiconductive layer is patterned using an embossing tool (in the form of a stamp, shim or other arrangement) having a suitable pattern of embossing features formed thereon in order to define the full electronic circuit (i.e. all devices and their interconnections in a single embossing step).

Figure 23:
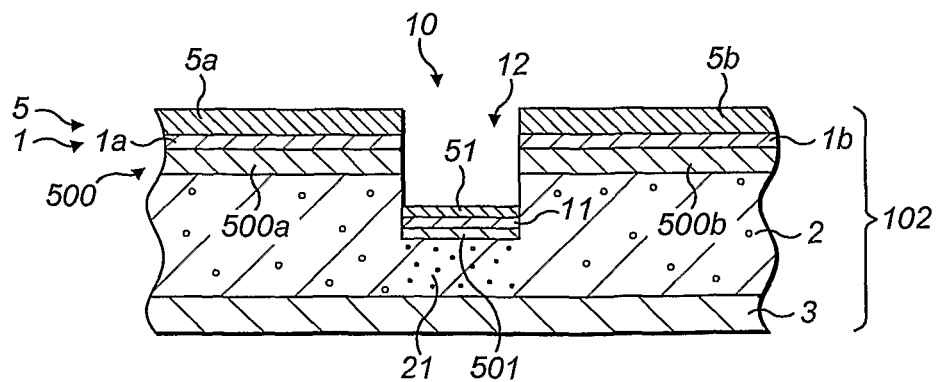
FIG. 23 is a schematic representation of a cross section of part of an electronic device embodying the invention.

Referring now to FIG. 23, an electronic device embodying the invention comprises a multi-layer device substrate 102. This substrate 102 comprises a layer 1 of semiconductive material, a first (upper) layer 5 of insulative material formed over the semiconductive layer 1, a second (lower) layer 500 of insulative material formed on the other side of the semiconductive layer 1, a layer or body of compressible material 2 supporting the insulative and semiconductive layers 1, 5, 500, and a substantially non-compressible backing or support layer 3 supporting the compressible layer 2. In this example the layer of semiconductive material 1 is relatively thin and relatively non-compressible. In addition to the compressible layer 2, each of the insulative layers 5, 500 are at least partially compressible. An insulative feature 10 has been formed in the device substrate to completely interrupt the layer of semiconductive material 1, electrically isolating an undisplaced portion 1a from another undisplaced portion 1b in the direction across the feature 10. Insulative feature 10 has been formed by displacing respective portions 51, 11, 501 of the upper insulative layer, semiconductive layer, and lower insulative layer respectively. A corresponding portion 21 of the compressible material has been compressed beneath these displaced portions, i.e. between the displaced portions and the backing layer 3. In displacing these portions, the portion 51 of the upper insulative layer and portion 501 of the lower insulative layer on either side of the displaced portion of semiconductive layer have themselves been compressed and lie at the base of the trench 12 formed in the surface of the overall device substrate 102.

Figure 24:
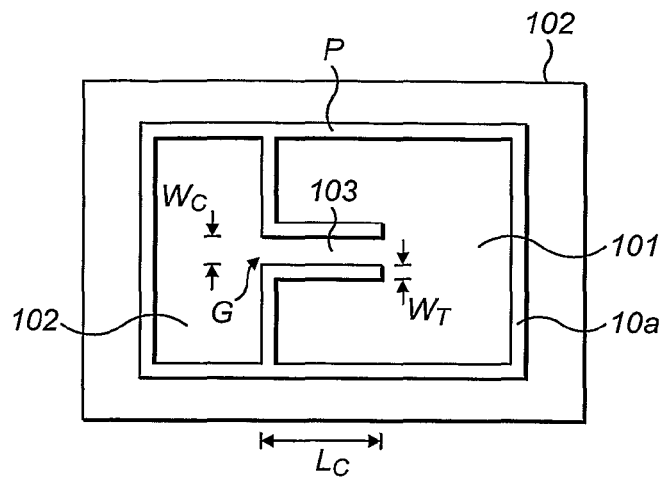
FIG. 24 is a schematic plan view of an electronic device embodying the invention.

Moving on to FIG. 24, this shows a device embodying the invention, in which a pattern 10a of insulative features (in this example insulative trenches) have been formed to interrupt the semi-conductive layer of a device substrate 102 to define a self-switching diode. The insulative features comprise a plurality of lines (or straight trenches) which are connected to define an insulative perimeter P, insulative lines extending inwardly from opposing sides of the perimeter P to define a gap G, and further insulative lines extending from the ends of the opposing lines defining the gap G towards a first portion 101 of the semiconductive layer. The insulative features define an elongate channel 103 (of length $L_c$, and width $W_c$) which provides a charge carrier flow path in the semiconductive layer from the first area 101 to a second area 102. In this embodiment the elongate channel 103 is dimensioned and arranged such that the parameters of the charge carrier flow path are dependent on a potential difference applied between the first and second areas 101, 102. The insulative features are arranged such that the device exhibits diode-like characteristics in response to application of a voltage across the first and second areas 101, 102. Further details on the operation of this device, and mechanisms contributing to this diode-like behaviour will be appreciated from WO 02/086973 A2, for example. In this embodiment, all of the insulative trenches forming the pattern of insulative features have the same width $W_t$. In certain embodiments, $W_t$ may be in the range 30-300 nm. Similarly, $W_c$ may be in the range 10-400 nm. Also, $L_c$ may be in the range 100-3000 nm.

It will be appreciated that the pattern of insulative features 10a shown in FIG. 24 defines a single electronic device, namely a single diode. In other embodiments of the invention, a plurality of electronic devices may be formed in a single common substrate by patterning with insulative features, and interconnections may also be provided to form at least part of an electronic circuit.

Figure 25:
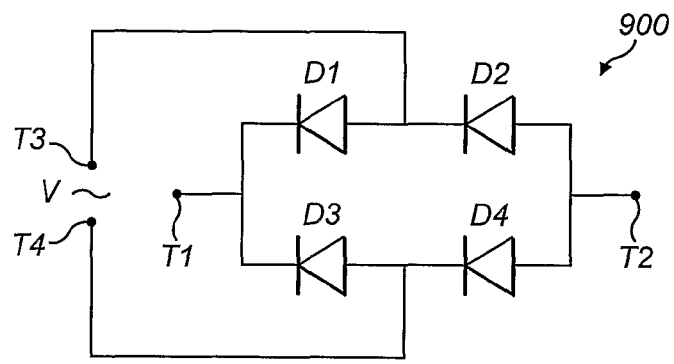
FIG. 25 is a schematic representation of an electronic circuit which may be manufactured using methods embodying the invention.
Figure 26:
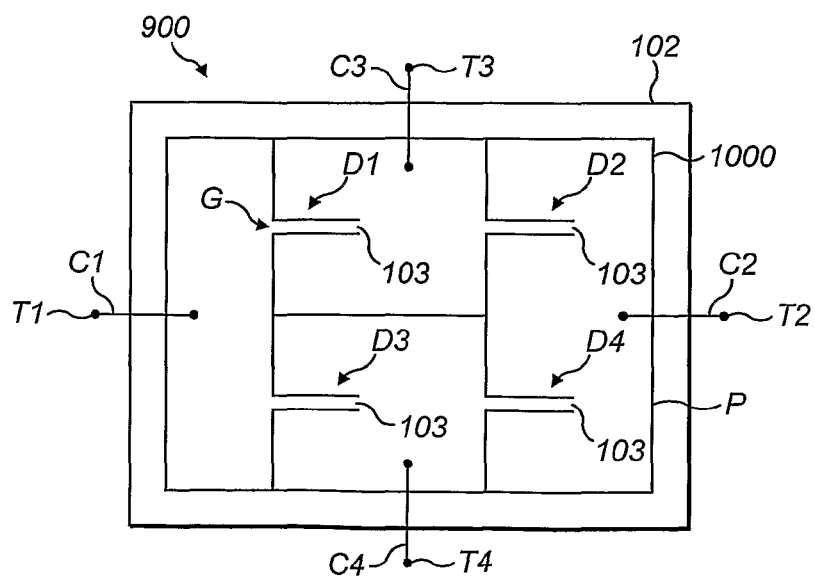
FIG. 26 is a schematic plan view of the circuit of FIG. 25 implemented in an embodiment of the invention (in other words FIG. 26 illustrates an electronic circuit embodying the invention.

FIG. 25 shows a rectifier circuit, and FIG. 26 shows that circuit formed in an embodiment of the invention. FIG. 25 shows the well-known arrangement of four diodes D1-D4 which can produce a rectified output at terminals T1 and T2 when an alternating voltage V is applied between terminals T3 and T4. FIG. 26 shows the rectifier circuit 900 as provided by an embodiment of the invention. A device substrate 102 comprising a layer of semiconductive material has been patterned with a pattern or array 1000 of insulative features (which may comprise trenches) to define the four diodes D1-D4 and the interconnections between them. Each diode has the general structure of the diode shown in FIG. 24 and described above, i.e. it comprises a narrow, elongate channel defined by the insulative features to give the self-switching behaviour. In other words, the asymmetric arrangement of the insulative features with respect to the gap between the features separating the nominal first area of semiconductive material on one side of the gap from the second area of semiconductive material on the other side of the gap is such that when a potential is applied between those two areas the potential in the first area affects the conductivity of the conductive channel through the gap via the insulative features defining it. This influence is asymmetric. With the potential difference in one sense, the conductivity of elongate channel can be reduced, even to zero, as depletion regions inside the channel inhibit or prevent charge carrier flow. In the opposite polarity, charge flow is permitted.

Still referring to FIG. 26, it will be appreciated that the arrangement of insulative features 1000, in addition to defining the four diodes D1-D4, defines portions of the layer of semiconductive material which provide interconnections between the devices. The circuit 900 of FIG. 26 comprises some additional connections C1-C4 (that is in addition to those provided by portions of the layer of semiconductive material itself) which provide connections between external terminals T1-T4 and respective portions of the device semiconductive layer.

Figure 27:
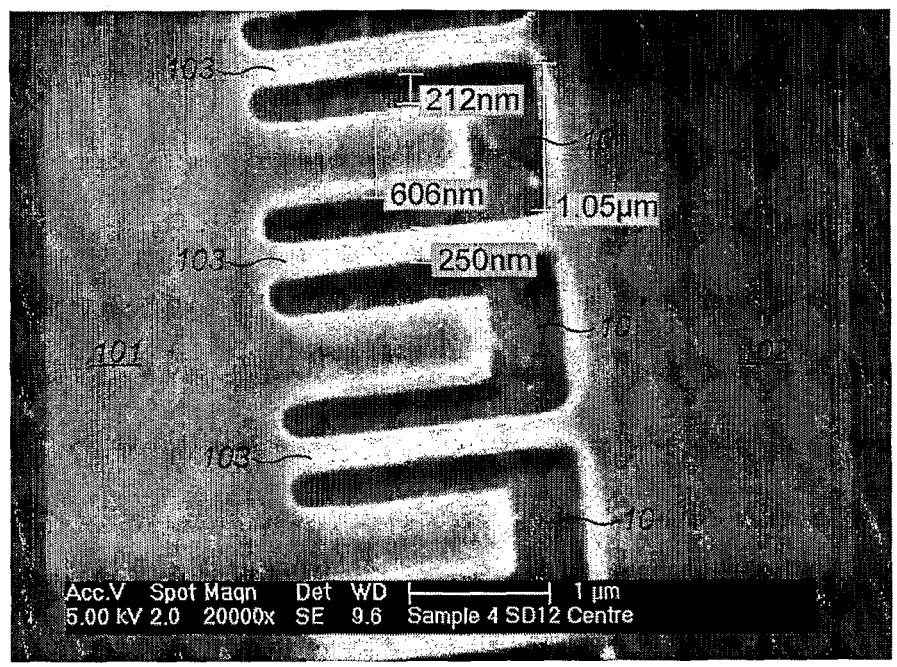
FIG. 27 is an image of part of an electronic device embodying the invention.

Referring now to FIG. 27, this is a microscope image of part of another electronic device embodying the invention. The figure shows a plurality of insulative features 10 formed in a device substrate. The insulative features 10 have been produced in parallel (i.e. at the same time) by an embossing process in which respective portions of the upper layer of semiconductive material in this example have been pressed or driven down into an underlying compressible layer so as to separate those portions from the undisplaced upper portion of semiconductive material. In effect, each insulative feature 10 has formed a trench in the semiconductive layer to interrupt that layer in the desired pattern, the displaced portions of semiconductive material being separated from the undisplaced layer, lying as they do at the bottom of each trench. The embossing tool has been patterned such that the insulative features 10 define a parallel array of diodes, each diode comprising a respective elongate channel 103 defined between adjacent insulative trenches and connecting a first portion or area 101 of the layer of semiconductive material to a second area or portion 102. The dimensions of certain features are indicated on the figure. For example, each channel 103 has an approximate width of 250 nanometres, and the width of the insulative trenches defining the sides of the channels are approximately 212 nanometres in this example. The device substrate in this example comprises an upper layer of semiconductive material P3HT. This has been formed on top of a compressible layer of PMMA, itself supported on a substantially non-compressible layer of $SiO_2$. The embossing tool used to produce the features in FIG. 27 was provided with a corresponding pattern of embossing features, and was urged into contact with the upper surface of the layer of P3HT with a force of 1.5 kN, at a temperature of 85° C. It will be appreciated from the figure that the insulative features 10 are well defined, and tests confirm that the resultant device exhibited clear diode-like characteristics.

Figure 28:
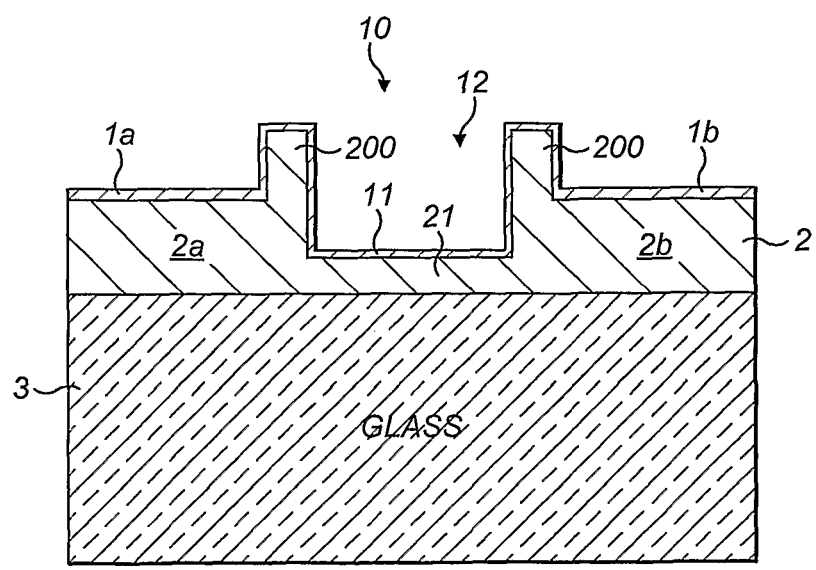
FIG. 28 is a schematic representation of the cross section of part of an electronic device embodying the invention.
Figure 29:
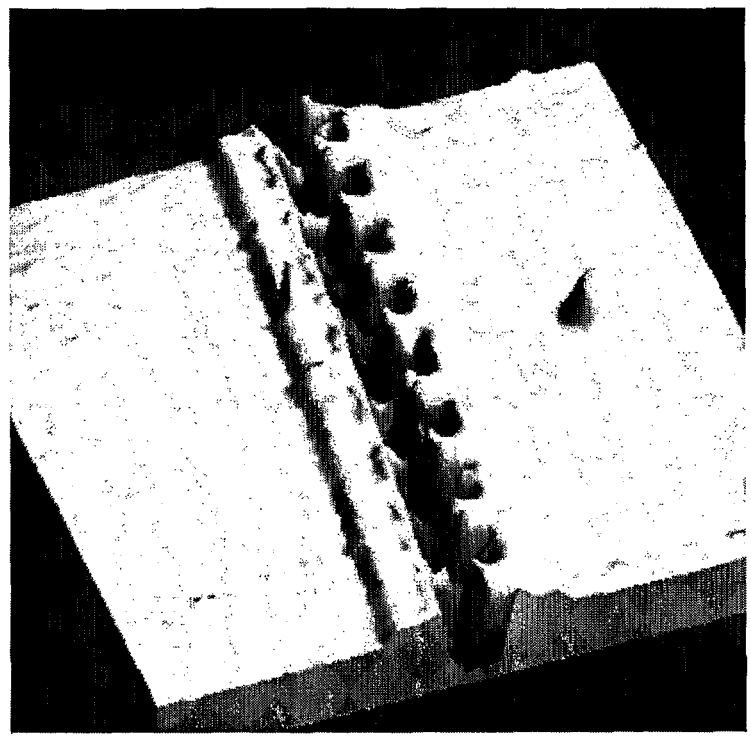
FIG. 29 is a microscope image of an insulative feature of an embodiment of the invention.
Figure 30:
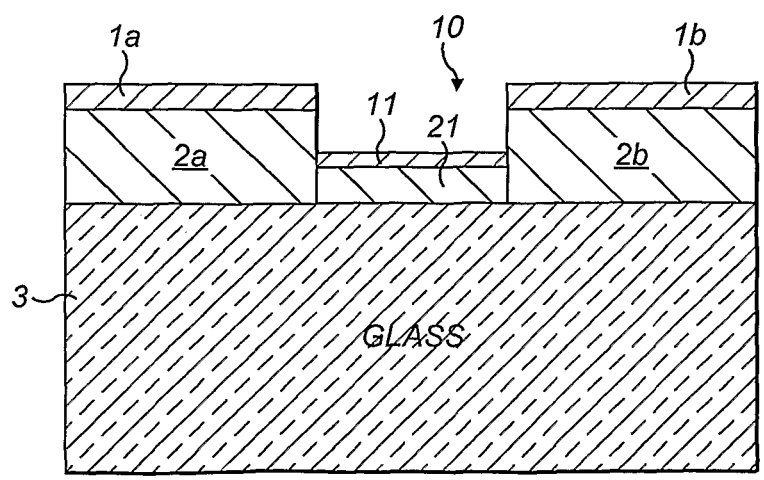
FIG. 30 is a schematic cross section of part of another electronic device embodying the invention.

Referring now to FIG. 28, this is a schematic representation of an insulative feature formed in another embodiment of the invention. Here, the semiconductive layer is a layer or organic semiconductive material, supported by a compressible layer of PMMA, itself supported on a glass support substrate. An embossing technique has been used to displace a portion 11 of the semiconductive layer down into the compressible layer 2 to form a trench. In this example, electrical separation between the displaced portion 11 and undisplaced portions 1a, 1b is not complete as a thin layer of semiconductive material lines the side walls of the trench 12, and indeed the embossing process has resulted in peaks or raised areas of compressible material 200, themselves coated with a layer of semiconductive material, being formed on either side of the trench. These features can be seen in the microscope image of another embodiment shown in FIG. 29. It will be appreciated that for certain applications, the partially insulative feature 10 shown in FIG. 28 may be adequate, but in other embodiments in which complete electrical isolation of the displaced portion 11 from the undisplaced portions 1a, 1b is required then further processing steps are needed. Such processing steps can include one or more steps to remove the layer of semiconductive material from the side walls of the trench 12 (and examples of such techniques include etching, for example). It will be appreciated that the distortion of the layer of compressible material 2 as a result of the embossing process shown in FIG. 28 may be dependent upon the particular compressible material being used and also the temperature at which the embossing process is being carried out. For example, in order to reduce or completely avoid the formation of protrusions 200, the embossing may be carried out at reduced temperature. In certain embodiments, the device substrate may be cooled to a predetermined temperature before embossing, such that the embossing process may then result in the formation of an insulative feature closer to the ideal form shown in FIG. 30.

Further embodiments will now be described with reference to FIGS. 31-35.

Referring to the embodiment as shown in FIG. 31A, the pre-form 1, consists of a carrier substrate of PET (polyethylene terepthalate) 2 upon which is a yielding layer 3 of polymethylmethacrylate (100 nm is spin-coated from a 0.3% wt anisole solution, mw 950,000). The yielding layer 3 is also non-conductive. A monolayer of self-assembled material 4 (octadecyltrichlorosilane (OTS) of approx. 1 nm thickness is dip-coated from 1% wt solution in cyclohexane or n-methylpentane (NMP) at 21° C. or less—OTS can also be spin-coated from NMP or vapour-deposited) is located on the yielding layer 3 with the active layer 5 (20 nm of poly-3-hexylthiophene obtained from Sigma-Aldrich is spin-coated from a 1% wt trichlorobenzene solution) located on the layer 4.

The stamp 6 has a base area 7 and raised embossing areas 8.

In a method embodying the invention, the stamp 6 is pressed into the active layer 5 of the pre-form 1 in order to form the device template 9 as shown in FIG. 31B. The stamp is pressed into the template until the base area 7 comes into contact with the surface of the active layer 5. The stamp is subsequently removed.

Displaced portions 10 of active layer 5 are punched by the raised embossing areas 8 of the stamp 6 into the yielding layer 3. Carried with them are displaced portions 11 of the self-assembled polymer layer 4. The yielding layer 3 beneath the displaced portions 10, 11 is permanently compacted to allow the displacement. Apertures 12 are thus formed in the active layer 5. The gap 13 ensures that the displaced portions 10 of active layer 5 are not in conductive contact with the undisplaced active layer 5.

Referring to the embodiment as shown in FIG. 32A, the pre-form 20, consists of a carrier substrate of PET 2 upon which is a yielding layer 3 of polymethylmethacrylate (100 nm is spin-coated from a 0.3% wt anisole solution, mw 950, 000). A layer of non-conductive material 14 (150 nm of polyvinylacetate is spin-coated from 1% wt aqueous solution) is located on the yielding layer 3 with the active layer 5 (30 nm of "polyquaterthiophene" PQT12 is spin-coated from 1% wt trichlorobenzene) located on the non-conductive layer 14.

As for the above method embodying the invention, the stamp 6 is pressed into the active layer 5 of pre-form 1 in order to form the device template 9 as shown in FIG. 31B. The base area 7 is not brought into contact with the surface of the active layer 5, but is stopped by a control mechanism (not shown) after penetrating a predetermined distance into the template. The stamp is then removed.

Displaced portions 10 of active layer 5 are punched by the raised areas of the stamp 6 into the non-conducting layer 14. Carried with them are displaced portions 16 of the non-conductive layer 14. The yielding layer 3 beneath the displaced portions 10, 16 is permanently compacted to allow the displacement. Apertures 12 are thus formed in the active layer 5. The gap 13 ensures that the displaced portions 10 of active layer 5 are not in conductive contact with the undisplaced active layer 5.

Figure 33:
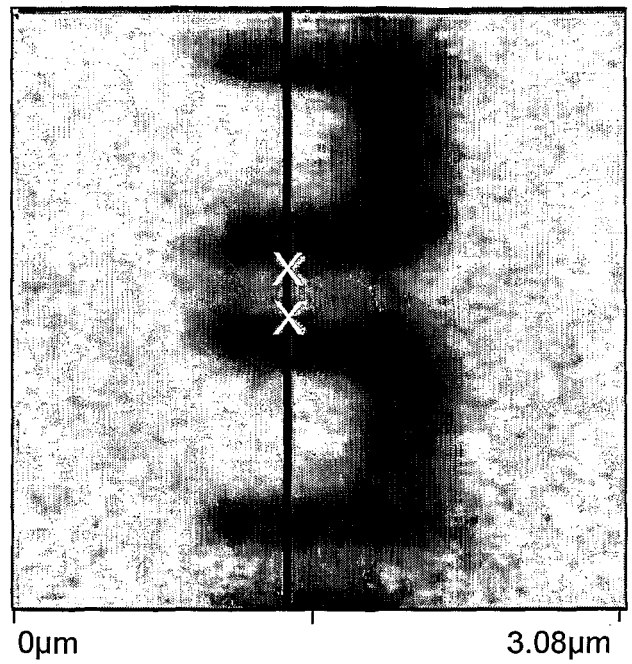
FIG. 33 is an image of a stamp suitable for use in a method embodying the invention.

Referring now to FIG. 33, this shows an image (by atomic force microscopy) of a stamp 6 for use in the embodiments of FIGS. 31A and 31B. The stamp is of nickel. The "]" shapes correspond to the raised embossing area 7, while the surrounding surface is the base area 8.

Figure 34:
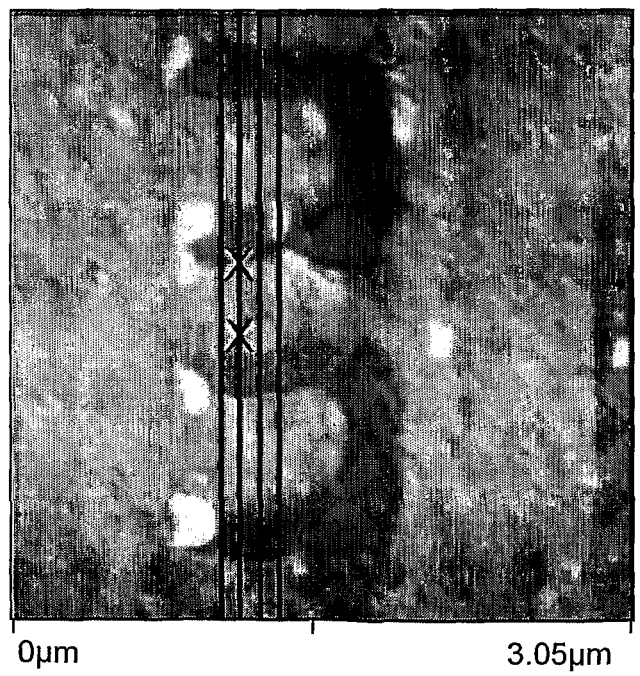
FIG. 34 is an image of a device prepared using the stamp of FIG. 33.
Figure 35:
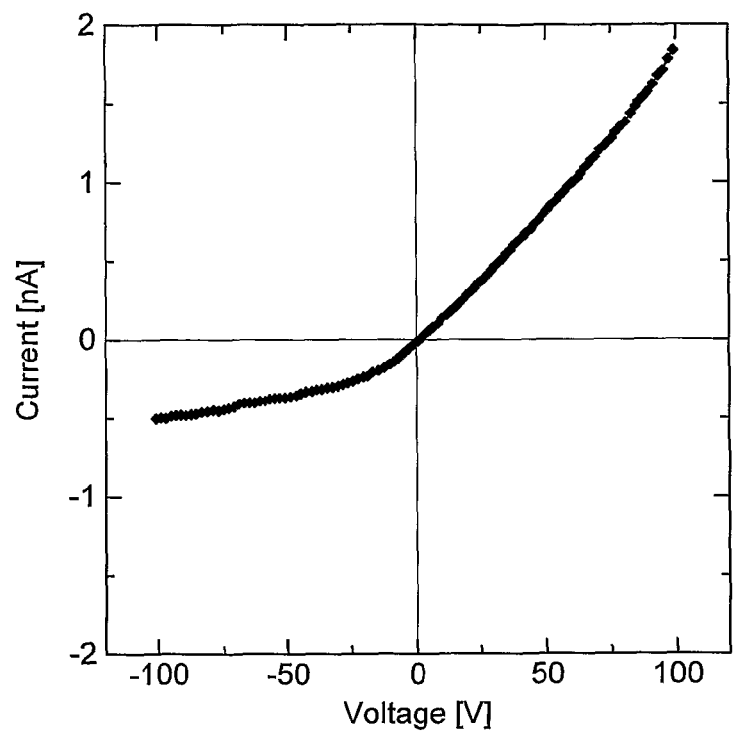
FIG. 35 is a current/voltage plot for the device as shown in FIG. 34.

FIG. 34 shows an atomic force micrograph of a device prepared using the stamp 6, where the "]" shapes are disturbed active layer 10 and the rest of the active layer shown 5 remains undisturbed, defining the features of a planar nanoelectronic diode between the two "x" marks Referring now to FIG. 35, this shows a current/voltage plot obtained for the device of FIG. 34, obtained after electrical contacts have been applied to the active layer 5 of the device. An insulating region is formed by the "]" areas of disturbed active layer 10. The elongate channel between the two "x" marks is formed with the conductivity of the elongate channel dependent upon the potential difference across the "]" shaped areas of disturbed active layer 10 (i.e. the device functions as a diode).

It will be appreciated that numerous modifications to the above described embodiments may be made without departing from the scope of the invention as defined in the appended claims. For example, a protective layer may be situated on the template over the active layer.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be considered as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Figure 36:
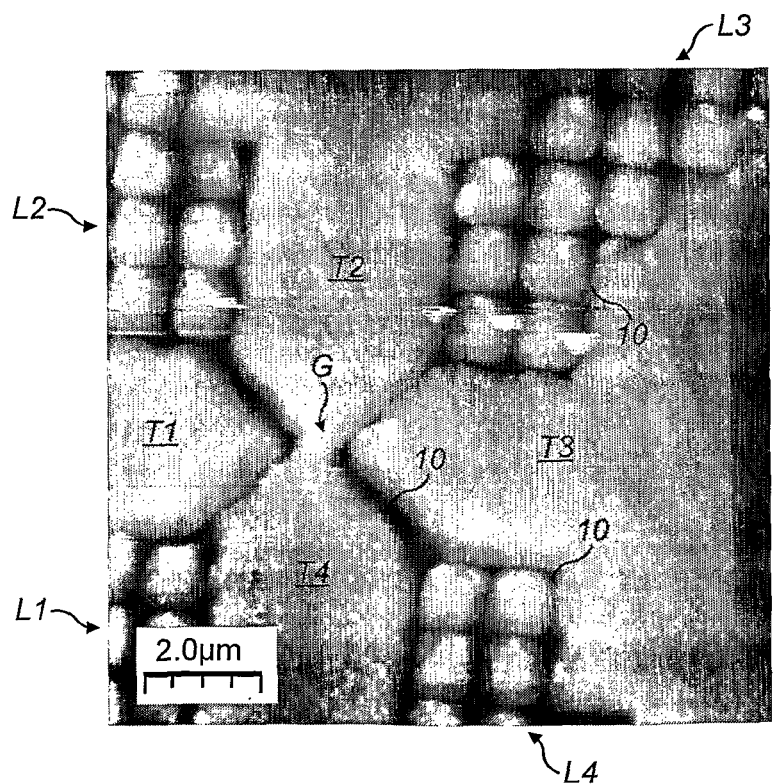
FIG. 36 is an image of a nano transistor embodying the invention and manufactured using a method embodying the invention.
Figure 37:
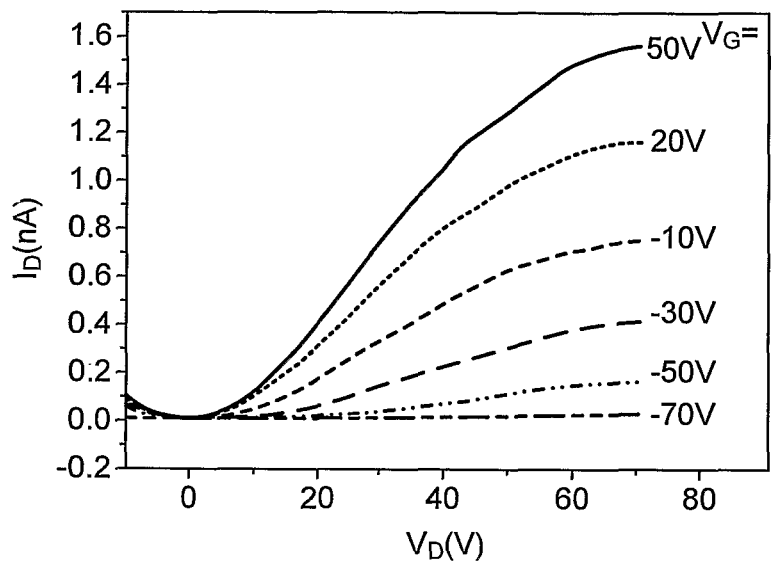
FIGS. 37 and 38 are output and transfer characteristics, respectively, of the transistor of FIG. 36.
Figure 38:
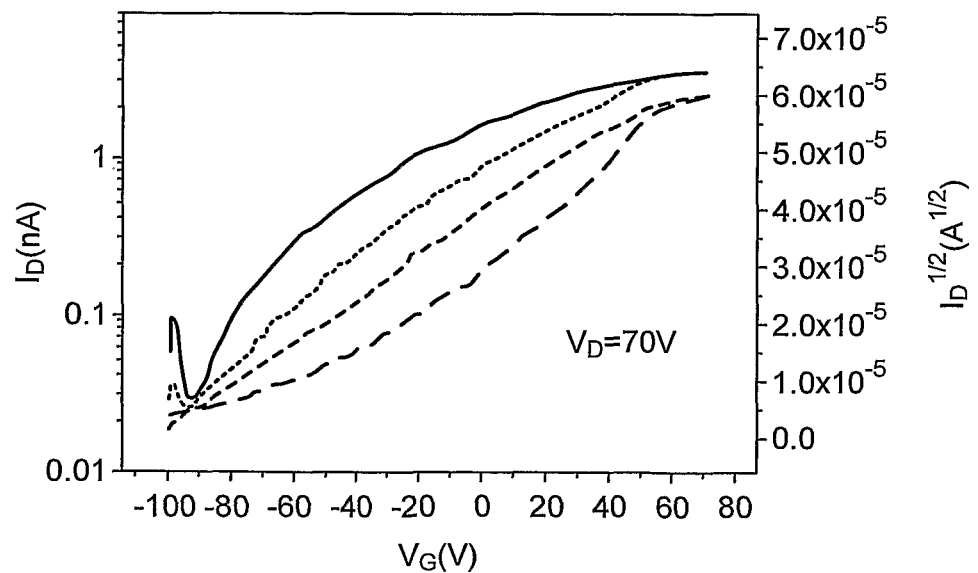

Referring now to FIGS. 36 to 38, another embodiment of the invention is an embossed ZnO planar nano-transistor. Output and transfer characteristics of that embossed ZnO planar nano-transistor are shown in FIGS. 37 and 38 respectively. The on/off ratio of the transistor is about 300. The transistor is formed from a substrate having the general structure: ZnO (10 nm)/PMMA (1000 nm)/SiO$_2$/Si. The method of manufacturing the transistor comprised: clamping (tool and substrate) at RT; heating up to 110° C.; applying force 2000N which translates to a pressure 500 N/cm2; holding for 30 mins; cooling down; de-molding (separating) at RT.

It will be appreciated that certain embodiments of the invention comprise a thermal embossing technique in which pressure and/or heat may be used to produce the desired pattern of insulative features in a semiconductive substrate or layer. In certain embodiments, the applied pressure, and/or the heating may be pulsed. Certain embodiments provide methods for manufacturing planar, nanoelectronic devices, in which an entire device or indeed an entire circuit or part of the circuit comprising a plurality of devices can be fabricated in a single step (i.e. a single patterning step).

In certain embodiments, a semiconductive layer can be patterned using a stamp or other embossing tool. Some such tools incorporate embossing features with a 1:1 aspect ratio (i.e. the height of the feature above the base surface is substantially equal to the minimum separation of the features). Such an arrangement may be used where the embossing tool is in the form of a flexible sheet or shim for use in a technique in which the embossing tool is supported on a roll for rapid manufacture of many devices in parallel, or indeed of large devices (i.e. devices occupying a large area of semiconductive material on a substrate).

Devices successfully manufactured using techniques embodying the invention have included electronic devices with ZnO as the active semiconductive material. Further devices have been successfully manufactured incorporating other semiconductive materials, including organic semiconductive materials such as P3HT.

It will be appreciated that an advantage of certain embodiments of the invention is that in a single step one can form a single pattern in a layer of semiconductive material to define an entire device, plurality of devices, part of an electronic circuit, or indeed an entire electronic circuit.

It will be appreciated that in addition to being able to produce insulative features in a semiconductive layer, techniques embodying the invention may also be used to emboss "optical" features (i.e. visible, optically detectable features) on the device substrate. Such features may be useful for security and/or alignment purposes for example.

In certain embodiments, an embossing tool may be used, that embossing tool taking the form of a stamp in which the pattern of embossing features has been "written" (i.e. patterned, or made) using an E-beam.

In certain embodiments, the compressible layer, which may also be described as a buffer layer, may comprise compressible, porous material, such as compressible, porous, solution-processible polymers.

In certain embodiments, the semiconductive material used is a polymer semiconductor. In general, layers of such materials are flexible, and the method of patterning such a layer by embossing into a compressible layer may comprise initially cooling the semi-conductor material to a predetermined temperature to reduce its flexibility and improve the definition of the insulative features formed. In other words, by setting the temperature of the semiconductive material to a suitable value before embossing, lining of the insulative trenches with semiconductive material can be reduced or avoided.

It will be appreciated that certain embodiments of the invention produce, in a single embossing step, one or more complete active electronic devices defined in a single layer of semiconductive material. In certain embodiments, the width of embossing features on an embossing tool can be less than 500 nanometres, less than 200 nanometres, or even less than 100 nanometres. The aspect ratio of the embossing features may be 1:1, 1:2, 1:3, or higher, such as 1:10. However, these aspect ratios are merely examples, and other embodiments may employ embossing tools having other aspect ratios for their insulative features.

In certain embodiments, the materials selected for the semiconductive layer and compressible layer are such that there is good adhesion between the two layers, and they can be provided in direct contact with one another. However, in certain other embodiments the semiconductive and compressible materials may not adhere well to each other (as is the case when the semiconductive material is ZnO and the compressible material is PMMA). In such examples, the surface of the compressible layer may be processed or treated in some way (for example by plasma treatment) to improve the adhesion of the semiconductive layer when formed upon it.

In certain embodiments, a semiconductive layer of P3HT is provided (i.e. formed) on a compressible layer of PMMA. Such a combination may be formed by techniques using appropriate solutions; these materials are such that "orthogonal" solvents can be used (i.e. the solvent for one of the materials can be selected so as not to be a solvent for the other material). The advantages of this will be apparent to the person skilled in this field.

In certain embodiments, the semiconductive material provided as a layer and patterned with insulative features can be a metal oxide semiconductor (such as ZnO), a polymer semiconductor, or for example a small molecule organic semiconductive material.

In certain embodiments, the embossing tool may be formed from nickel, for example produced from a silicone master.

The embossing methods employed by embodiments of the invention in certain instances comprise punching through the active layer of semiconductive material, driving selected portions down into the compressible layer (which may also be described as a buffer or yielding layer). Thus, active material may be pushed or driven into the buffer layer, by displacing it from its initial position and plane.

Factors which may be adjusted in methods embodying the invention include: the temperature at which the embossing is performed (and there is further flexibility to set the temperatures of the embossing tool and device substrate to be embossed separately, and indeed to alter temperatures during the embossing process); the pressure applied between the embossing tool and the device substrate; the material selected for the various device substrate layers; the thicknesses of the various layers and the dimensions of the embossing features on any embossing tool; the hardness of the materials being used for the various layers; and the size of the features provided on any embossing tool. In certain embodiments, it is desirable to employ relatively brittle semiconductive material before the embossing process is performed. This can involve the selection of intrinsically brittle material for the semiconductive layer, or indeed can comprise setting process conditions such that the layer of semiconductive material is relative brittle when the embossing takes place. In certain embodiments, an embossing tool may become contaminated or otherwise coated by material from the device substrate during the embossing process. In order to reduce this, certain embodiments employ coating or otherwise treating the embossing tool before patterning the semiconductive layer to reduce adhesion between the device substrate and the tool.

In certain embodiments, the layer of insulative compressible material may be PMMA. In certain examples, this may be selected to have high molecular weight, or indeed low molecular weight, giving different characteristics under compression. In other words, materials having different initial densities may be selected for use as the compressible material, giving a further adjustable parameter in the process.

In certain embodiments, a scratching or etching technique may be employed to further enhance the insulative features after embossing, for example to clean out any semiconductive material remaining in the formed trenches. In other embodiments, such further processing may not be required.

In certain embodiments, a layer of ZnO of thickness in the range 5-20 nanometres, e.g. 11 nanometres, may be provided on a supporting compressible layer of PMMA having a thickness in the range 500-1000 nanometres, e.g. 800 nanometres. With the supporting compressible layer being substantially thicker than the semiconductive layer, relatively high embossing features on the embossing tool may be used to achieve good isolation between the displaced portions of semiconductive material and the undisplaced layer. In certain embodiments the embossing tool may take the form of an embossing shim, and may be held in contact with the device substrate at a temperature of 95° C., for example, for a time of 30 minutes for example.

In certain embodiments, a relatively non-compressible support substrate comprising or consisting of glass may be used to support the compressible layer, which may additionally or alternatively be selected so as to have a low density, such as for a buffer layer of a porous polymer.

It will be appreciated that methods embodying the present invention may be used to manufacture electronic devices which may be described as planar, or substantially planar, electronic devices and/or devices which may be described as two-dimensional, or substantially two-dimensional, electronic devices, in which the electronic properties of the devices are determined by the arrangement of insulative features interrupting a single layer of semi-conductive material.

The invention claimed is:

1. A method of manufacturing an electronic device comprising a layer of semiconductive material and at least one insulative feature, the or each insulative feature being arranged to interrupt the layer of semiconductive material, the method comprising:
providing a layer of semiconductive material, and a layer of compressible material supporting the layer of semiconductive material; and
forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;
wherein the said displacing comprises producing an inelastic deformation of compressible material under the or each displaced portion, so as to leave the or each displaced portion permanently offset from the layer of semiconductive material.

2. A method in accordance with claim 1, wherein the electronic device comprises a plurality of said insulative features.

3. A method in accordance with claim 1, wherein the insulative feature or features define a pattern, and the step of forming the or each insulative feature comprises patterning the layer of semiconductive material with the insulative feature or features.

4. A method in accordance with claim 3, wherein the pattern defines at least one electrical and/or electronic characteristic of the device.

5. A method in accordance with claim 3, wherein the electronic device is an active device.

6. A method in accordance with claim 3, wherein the pattern defines at least one elongate channel of semiconductive material extending from a first portion of the layer of semiconductive material to a second portion of the layer of semiconductive material.

7. A method in accordance with claim 6, wherein the pattern defines at least one gate region of the layer of semiconductive material to which a potential may be applied to control a conductivity of the elongate channel.

8. A method in accordance with claim 7, wherein the gate region comprises at least part of one of the first and second portions.

9. A method in accordance with claim 7, wherein the gate region is distinct from the first and second portions.

10. A method in accordance with claim 3, wherein the pattern is arranged such that the device is operable as at least one of: a self-switching device; a diode; a FET; a memory device; and a logic gate.

11. A method in accordance with claim 3, wherein the pattern is arranged to define a plurality of electronic devices in the layer of semiconductive material.

12. A method of manufacturing an electronic device comprising a layer of semiconductive material and at least one insulative feature, the or each insulative feature being arranged to interrupt the layer of semiconductive material, the method comprising:
providing a layer of semiconductive material, and a layer of compressible material supporting the layer of semiconductive material;
forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;
wherein the insulative feature or features define a pattern, and the step of forming the or each insulative feature comprises patterning the layer of semiconductive material with the insulative feature or features;
wherein the pattern is arranged to define a plurality of electronic devices in the layer of semiconductive material;
wherein the pattern is further arranged to define at least one connecting portion of semiconductive material in the layer of semiconductive material, the or each connecting portion providing an electrical connection between a respective pair of said plurality of electronic devices.

13. A method in accordance with claim 3, wherein the pattern is arranged to define a plurality of electronic devices and interconnections in the layer of semiconductive material, the plurality of electronic devices and interconnections forming at least part of an electronic circuit.

14. A method in accordance with claim 1, wherein the or each selected portion has a width in the range from 300 nm to 1 mm.

15. A method in accordance with claim 1, wherein the layer of semiconductive material has a thickness T and said displacing comprises displacing the or each selected portion towards the compressible material by a distance greater than T.

16. A method of manufacturing an electronic device comprising a layer of semiconductive material and at least one insulative feature, the or each insulative feature being arranged to interrupt the layer of semiconductive material, the method comprising:
   providing a layer of semiconductive material, and a layer of compressible material supporting the layer of semiconductive material; and
   forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;
   wherein the layer of semiconductive material has a thickness T and said displacing comprises displacing the or each selected portion towards the compressible material by a distance less than or equal to T.

17. A method in accordance with claim 1, wherein the layer of semiconductive material has a thickness T and said inelastic deformation is such that the or each displaced portion is permanently displaced by a distance greater than T.

18. A method in accordance with claim 1, wherein the displacement of the or each selected portion forms a permanent depression or trench in the layer of semiconductive material.

19. A method in accordance with claim 18, further comprising removing semiconductive material from side walls of the or each depression or trench.

20. A method in accordance with claim 18, further comprising filling the or each depression or trench with insulative material.

21. A method in accordance with claim 1, wherein said displacing comprises severing the or each selected portion of semiconductive material from the layer of semiconductive material.

22. A method of manufacturing an electronic device comprising a layer of semiconductive material and at least one insulative feature, the or each insulative feature being arranged to interrupt the layer of semiconductive material, the method comprising:
   providing a layer of semiconductive material, and a layer of compressible material supporting the layer of semiconductive material; and
   forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;
   wherein said compressible material is porous and said displacing comprises compressing the compressible material to reduce a porosity of the compressible material under the or each displaced portion.

23. A method in accordance with claim 1, wherein said displacing comprises compressing compressible material from a first density to a second, higher density.

24. A method in accordance with claim 1, wherein said compressible material is an insulative material selected from a list comprising: polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate.

25. A method in accordance with claim 1, further comprising providing a substrate arranged to support the compressible layer.

26. A method in accordance with claim 25, wherein the substrate is substantially non-compressible.

27. A method in accordance with claim 1, further comprising providing a support surface, and supporting the compressible layer with the support surface during said displacing.

28. A method in accordance with claim 1, wherein the layer of compressible material is arranged to support the layer of semiconductive material directly.

29. A method of manufacturing an electronic device comprising a layer of semiconductive material and at least one insulative feature, the or each insulative feature being arranged to interrupt the layer of semiconductive material, the method comprising:
   providing a layer of semiconductive material, and a layer of compressible material supporting the layer of semiconductive material; and
   forming the or each insulative feature by a method comprising displacing a respective selected portion of the layer of semiconductive material towards the compressible material so as to compress compressible material under the or each displaced portion and separate at least partly the or each displaced portion from undisplaced semiconductive material; and
   providing at least one intermediate layer of material between the layer of semiconductive material and the layer of compressible material.

30. A method in accordance with claim 1, wherein said displacing comprises pressing the or each selected portion towards the compressible layer using an embossing tool.

31. A method in accordance with claim 30, wherein the embossing tool comprises at least one embossing feature raised above a base surface, the method comprising urging the embossing tool towards the compressible layer such that each embossing feature displaces a respective selected portion of the layer of semiconductive material.

32. A method in accordance with claim 31, wherein the embossing tool comprises a plurality of said embossing features arranged to define the pattern of insulative features in the semiconductive layer of the device.

33. A method in accordance with claim 32, the method further comprising using the embossing tool to displace a plurality of selected portions of the layer of semiconductive material in parallel.

34. A method in accordance with claim 32, comprising using the embossing tool to displace a plurality of portions of semiconductive material in parallel so as to define a plurality of devices.

35. A method in accordance with claim 31, further comprising arranging the embossing tool such that the base surface is substantially planar, arranging the layer of semiconductive material to be substantially planar and parallel to the base surface, and urging the embossing tool towards the layer of semiconductive material such that each embossing feature displaces a respective selected portion of the layer of semiconductive material at the same time.

36. A method in accordance with claim 35, wherein the embossing tool is substantially rigid.

37. A method of manufacturing an electronic device comprising a layer of semiconductive material and at least one insulative feature, the or each insulative feature being arranged to interrupt the layer of semiconductive material, the method comprising:

providing a layer of semiconductive material, and a layer of compressible material supporting the layer of semiconductive material; and forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;

wherein said displacing comprises pressing the or each selected portion towards the compressible layer using an embossing tool, wherein the embossing tool comprises at least one embossing feature raised above a base surface;

urging the embossing tool towards the compressible layer such that each embossing feature displaces a respective selected portion of the layer of semiconductive material;

arranging the embossing tool such that the base surface is substantially planar;

arranging the layer of semiconductive material to be substantially planar and parallel to the base surface; and urging the embossing tool towards the layer of semiconductive material such that each embossing feature displaces a respective selected portion of the layer of semiconductive material at the same time;

wherein the embossing tool is substantially flexible, and the method further comprises supporting the embossing tool on a substantially planar support surface.

38. A method in accordance with claim 31, further comprising arranging the embossing tool such that the base surface lies substantially on the surface of a cylinder having a longitudinal axis, and rotating the embossing tool about said axis to pattern the layer of semiconductive material with the or each embossing feature of the tool.

39. A method in accordance with claim 38, wherein the embossing tool is substantially rigid.

40. A method in accordance with claim 38, wherein the embossing tool is substantially flexible, the method further comprising supporting the embossing tool on a cylindrical surface.

41. A method of manufacturing an electronic device comprising a layer of semiconductive material and at least one insulative feature, the or each insulative feature being arranged to interrupt the layer of semiconductive material, the method comprising:

providing a layer of semiconductive material, and a layer of compressible material supporting the layer of semiconductive material; and forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;

wherein said displacing comprises pressing the or each selected portion towards the compressible layer using an embossing tool, wherein the embossing tool comprises at least one embossing feature raised above a base surface;

urging the embossing tool towards the compressible layer such that each embossing feature displaces a respective selected portion of the layer of semiconductive material;

arranging the embossing tool such that the base surface lies substantially on the surface of a cylinder having a longitudinal axis;

rotating the embossing tool about said axis to pattern the layer of semiconductive material with the or each embossing feature of the tool;

wherein the layer of semiconductive material and the layer of compressible material are substantially flexible, and the method further comprises supporting the layers of semiconductive and compressible material on a cylindrical support surface during said displacing.

42. A method in accordance with claim 31, wherein at least one embossing feature comprises an embossing surface raised a distance d above the base surface.

43. A method in accordance with claim 42, wherein the or each embossing surface is substantially flat.

44. A method in accordance with claim 43, wherein the or each embossing feature has a substantially rectangular cross section.

45. A method in accordance with claim 42, wherein the or each embossing surface has a width w.

46. A method in accordance with claim 45, wherein d is substantially equal to w.

47. A method in accordance with claim 45, wherein d is >w.

48. A method in accordance with claim 47, wherein d is ≥2w.

49. A method in accordance with claim 45, wherein the embossing tool comprises a plurality of embossing features, and wherein the minimum separation between any two of such embossing features is ≥w.

50. A method in accordance with claim 30, wherein the embossing tool comprises at least one embossing surface, the method comprising using the or each embossing surface to press a respective selected portion of the layer of semiconductive material towards the compressible layer.

51. A method in accordance with claim 50, further comprising pressing the or each embossing surface directly against a respective portion of the layer of semiconductive material to displace that portion.

52. A method of manufacturing an electronic device comprising a layer of semiconductive material and at least one insulative feature, the or each insulative feature being arranged to interrupt the layer of semiconductive material, the method comprising:

providing a layer of semiconductive material, and a layer of compressible material supporting the layer of semiconductive material; and forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;

wherein said displacing comprises pressing the or each selected portion towards the compressible layer using an embossing tool, wherein the embossing tool comprises at least one embossing surface;

using the or each embossing surface to press a respective selected portion of the layer of semiconductive material towards the compressible layer; and coating the or each embossing surface before using each coated embossing surface to displace a respective portion of the layer of semiconductive material.

53. A method in accordance with claim 50, further comprising providing at least one separating layer of material between the embossing tool and the layer of semiconductive material, and using the embossing tool to press the or each selected portion of semiconductive material towards the compressible layer through the separated layer or layers.

54. A method in accordance with claim 30, further comprising setting a temperature of the layer of semiconductive material to a predetermined value t1 before using the embossing tool to displace the or each selected portion.

55. A method in accordance with claim 54, further comprising setting a temperature of the embossing tool to a predetermined value t2 before using the embossing tool to displace the or each selected portion of semiconductive material.

56. A method in accordance with claim 55, wherein t1 =t2.

57. A method in accordance with claim 55, wherein t1 does not equal t2.

58. A method in accordance with claim 57, wherein t1 >t2.

59. A method in accordance with claim 57, wherein t1 <t2.

60. A method in accordance with claim 30, further comprising controlling a force applied to pattern the layer of semiconductive material with the embossing tool.

61. A method in accordance with claim 60, further comprising modulating said force.

62. A method in accordance with claim 30, further comprising controlling a length of time for which the embossing tool is pressing the or each selected portion.

63. A method in accordance with claim 1, wherein the semiconductive material comprises at least one semiconductive material selected from a list comprising: polymer semiconductor, organic semiconductor, printable inorganic semiconductor, crystalline inorganic semiconductor, amorphous inorganic semiconductor.

64. A method of manufacturing an electronic device comprising a layer of semiconductive material and at least one insulative feature, the or each insulative feature being arranged to interrupt the layer of semiconductive material, the method comprising:
  providing a layer of semiconductive material, and a layer of compressible material supporting the layer of semiconductive material; and
  forming the or each insulative feature by a method comprising displacing a respective selected portion of the layer of semiconductive material towards the compressible material so as to compress compressible material under the or each displaced portion and separate at least partly the or each displaced portion from undisplaced semiconductive material;
  wherein the semiconductive material is a precursor material, and the method further comprises processing the patterned layer of semiconductive material to render the semiconductive material semiconducting.

65. A method in accordance with claim 1, wherein the layer of compressible material comprises at least one compressible material selected from a list comprising: polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate.

66. A method of manufacturing an electronic circuit comprising a plurality of electronic devices and a plurality of interconnections between the electronic devices in a single layer of semiconductive material, the method comprising:
  providing a layer of semiconductive material, and a layer of compressible material supporting the layer of semiconductive material; and
  patterning the layer of semiconductive material with a plurality of insulative features, each insulative feature being arranged to interrupt the layer of semiconductive material and the pattern of insulative features defining the electronic devices and interconnections,
  wherein said patterning comprises:
  forming each insulative feature by a method comprising displacing a respective selected portion of the layer of semiconductive material towards the compressible material so as to compress compressible material under each displaced portion and separate at least partly each displaced portion from undisplaced semiconductive material;
  wherein the said displacing comprises producing an inelastic deformation of compressible material under the or each displaced portion, so as to leave the or each displaced portion permanently offset from the layer of semiconductive material.

* * * * *